(12) United States Patent
Matsuura

(10) Patent No.: US 12,519,054 B2
(45) Date of Patent: Jan. 6, 2026

(54) WIRE BONDED SEMICONDUCTOR DEVICE PACKAGE

(71) Applicant: TEXAS INSTRUMENTS INCORPORATED, Dallas, TX (US)

(72) Inventor: Masamitsu Matsuura, Beppu (JP)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 488 days.

(21) Appl. No.: 18/071,164

(22) Filed: Nov. 29, 2022

(65) Prior Publication Data

US 2024/0178125 A1 May 30, 2024

(51) Int. Cl.
*H01L 23/498* (2006.01)
*H01L 21/48* (2006.01)
(Continued)

(52) U.S. Cl.
CPC .... *H01L 23/49861* (2013.01); *H01L 21/4803* (2013.01); *H01L 23/3121* (2013.01);
(Continued)

(58) Field of Classification Search
CPC ........... H01L 23/49861; H01L 23/3121; H01L 23/145; H01L 21/4803; H01L 21/4842; H01L 21/561; H01L 24/05; H01L 24/29; H01L 24/45; H01L 24/48; H01L 24/49; H01L 24/73; H01L 24/83; H01L 24/85; H01L 24/92; H01L 24/97; H01L 2224/04042; H01L 2224/05624; H01L 2224/05644; H01L 2224/05647; H01L 2224/05655; H01L 2224/05664; H01L 2224/29006; H01L 2224/29012; H01L 2224/29014; H01L 2224/2919; H01L 2224/45124; H01L 2224/45139; H01L 2224/45144; H01L 2224/45147; H01L 2224/45664; H01L 2224/48106; H01L 2224/48225; H01L 2224/48464; H01L 2224/48465; H01L 2224/48479; H01L 2224/4848; H01L 2224/49175; H01L 2224/73265; H01L 2224/83192;
(Continued)

(56) References Cited

U.S. PATENT DOCUMENTS

| 2003/0234445 A1* | 12/2003 | Wang ................ H01L 23/49551 |
| | | 257/E23.047 |
| 2004/0047151 A1* | 3/2004 | Bogner ................... H01L 25/13 |
| | | 362/240 |
| 2012/0238058 A1* | 9/2012 | Luo ..................... H01L 23/4334 |
| | | 438/111 |

* cited by examiner

*Primary Examiner* — Tu-Tu V Ho
(74) *Attorney, Agent, or Firm* — Dawn Jos; Frank D. Cimino

(57) ABSTRACT

In a described example, an apparatus includes: a metal leadframe including a dielectric die support formed in a central portion of the leadframe, and having metal leads extending from the central portion, portions of the metal leads extending into the central portion contacted by the dielectric die support; die attach material over the dielectric die support; a semiconductor die mounted to the dielectric die support by the die attach material, the semiconductor die having bond pads on a device side surface facing away from the dielectric die support; electrical connections extending from the bond pads to metal leads of the leadframe; and mold compound covering the semiconductor die, the electrical connections, the dielectric die support, and portions of the metal leads, the mold compound forming a package body.

20 Claims, 21 Drawing Sheets

(51) Int. Cl.
 *H01L 23/00* (2006.01)
 *H01L 23/31* (2006.01)
 *H01L 21/56* (2006.01)
 *H01L 23/14* (2006.01)

(52) U.S. Cl.
 CPC .............. *H01L 24/05* (2013.01); *H01L 24/29* (2013.01); *H01L 24/45* (2013.01); *H01L 24/48* (2013.01); *H01L 24/49* (2013.01); *H01L 24/73* (2013.01); *H01L 24/83* (2013.01); *H01L 24/85* (2013.01); *H01L 24/92* (2013.01); *H01L 21/4842* (2013.01); *H01L 21/561* (2013.01); *H01L 23/145* (2013.01); *H01L 24/97* (2013.01); *H01L 2224/04042* (2013.01); *H01L 2224/05624* (2013.01); *H01L 2224/05644* (2013.01); *H01L 2224/05647* (2013.01); *H01L 2224/05655* (2013.01); *H01L 2224/05664* (2013.01); *H01L 2224/29006* (2013.01); *H01L 2224/29012* (2013.01); *H01L 2224/29014* (2013.01); *H01L 2224/2919* (2013.01); *H01L 2224/45124* (2013.01); *H01L 2224/45139* (2013.01); *H01L 2224/45144* (2013.01); *H01L 2224/45147* (2013.01); *H01L 2224/45664* (2013.01); *H01L 2224/48106* (2013.01); *H01L 2224/48225* (2013.01); *H01L 2224/48464* (2013.01); *H01L 2224/48465* (2013.01); *H01L 2224/48479* (2013.01); *H01L 2224/4848* (2013.01); *H01L 2224/49175* (2013.01); *H01L 2224/73265* (2013.01); *H01L 2224/83192* (2013.01); *H01L 2224/83395* (2013.01); *H01L 2224/83439* (2013.01); *H01L 2224/83444* (2013.01); *H01L 2224/83447* (2013.01); *H01L 2224/83455* (2013.01); *H01L 2224/8346* (2013.01); *H01L 2224/83464* (2013.01); *H01L 2224/85181* (2013.01); *H01L 2224/85186* (2013.01); *H01L 2224/85205* (2013.01); *H01L 2224/85395* (2013.01); *H01L 2224/85439* (2013.01); *H01L 2224/85444* (2013.01); *H01L 2224/85447* (2013.01); *H01L 2224/85455* (2013.01); *H01L 2224/8546* (2013.01); *H01L 2224/85464* (2013.01); *H01L 2224/92247* (2013.01); *H01L 2224/97* (2013.01); *H01L 2924/01404* (2013.01); *H01L 2924/0665* (2013.01)

(58) Field of Classification Search
 CPC . H01L 2224/83395; H01L 2224/83439; H01L 2224/83444; H01L 2224/83447; H01L 2224/83455; H01L 2224/8346; H01L 2224/83464; H01L 2224/85181; H01L 2224/85186; H01L 2224/85205; H01L 2224/85395; H01L 2224/85439; H01L 2224/85444; H01L 2224/85447; H01L 2224/85455; H01L 2224/8546; H01L 2224/85464; H01L 2224/92247; H01L 2224/97; H01L 2924/01404; H01L 2924/0665
 USPC .......................................................... 257/668
 See application file for complete search history.

WIRE BONDED SEMICONDUCTOR DEVICE PACKAGE

TECHNICAL FIELD

This disclosure relates generally to semiconductor device packages, and more particularly to semiconductor device packages including a semiconductor die mounted on a chip-on-lead (COL) type package substrate. COL semiconductor device packages are smaller in area than other semiconductor packages because the package is formed without a central die pad.

BACKGROUND

Processes for producing microelectronic device packages include mounting a semiconductor die to a package substrate, making electrical connections from the semiconductor die to the package substrate, and covering the electronic devices with a protective dielectric material such as a mold compound to form packaged devices.

Small outline integrated circuit (SOIC) packages and small outline transistor (SOT) packages offer size reduction over dual inline packages (DIPs), which is desirable. In some SOT/SOIC packages, a semiconductor die is mounted to a package substrate, which can be a leadframe. To further reduce the size of the semiconductor device package, a COL package can be used. A COL package substrate has a semiconductor die mounted on a central lead, in contrast to a larger semiconductor package with a central die pad on a leadframe arranged for receiving the semiconductor die. The central die pad is as large or larger than the semiconductor die in area and spaced from the leads of the package substrate, which increases the total area of the semiconductor device package. Use of a COL package reduces the package area by mounting the semiconductor die on a smaller lead, instead of a central die pad. The central lead is smaller than the semiconductor die and supports the center of the semiconductor die.

The semiconductor die has bond pads on a device side surface for making electrical connections to the leads of the package substrate. In a wire bonded semiconductor device package, the electrical connections can be made by wire bonding. In an alternative approach the electrical connections can be made by ribbon bonding. A conductive wire or ribbon is bonded to bond pads on the semiconductor device using ultrasonic and thermal energy. In a COL package, the semiconductor die has an area greater than the lead it is mounted over. When a wire bonding process is applied to a semiconductor die mounted on a conventional COL package, the lack of mechanical support beneath portions of the semiconductor die can result in a weak or failed wire bond, leading to a scrapped device. Design and tooling for producing the COL wire bonded packages requires careful placement of semiconductor die and the bond pads, restricting the design of the semiconductor die, and use of a COL leadframe creates restrictions on the leadframe lead placements relative to the bond pad placements to ensure successful wire bonding. Additional reductions in the size of the semiconductor device packages, which is desirable, is limited by the need to place the bond pads and the leads very carefully in order to make reliable electrical connections to the bond pads on the semiconductor die. Modifications to the standard mechanical pressure and sonic energy used in the wire bonding process may be required when using a COL package substrate, increasing costs and reducing reliability of the resulting wire bonds.

SUMMARY

In an example, an arrangement includes: a metal leadframe including a dielectric die support formed in a central portion of the leadframe, and having metal leads extending from the central portion, portions of the metal leads extending into the central portion contacted by the dielectric die support; die attach material over the dielectric die support; a semiconductor die mounted to the dielectric die support by the die attach material, the semiconductor die having bond pads on a device side surface facing away from the dielectric die support; electrical connections extending from the bond pads to metal leads of the leadframe; and mold compound covering the semiconductor die, the electrical connections, the dielectric die support, and portions of the metal leads, the mold compound forming a package body.

An example method for forming an arrangement includes: forming a dielectric die support in a central portion of a metal leadframe, the metal leadframe having metal leads extending from the central portion; forming a die attach material over the dielectric die support; mounting a semiconductor die over the dielectric die support using the die attach material, the semiconductor die having bond pads on a device side surface facing away from the metal leadframe; forming electrical connections between bond pads of the semiconductor die and metal leads of the metal leadframe; and covering the semiconductor die, the dielectric die support, the electrical connections and portions of the metal leads with mold compound.

DETAILED DESCRIPTION

Figure 1A:
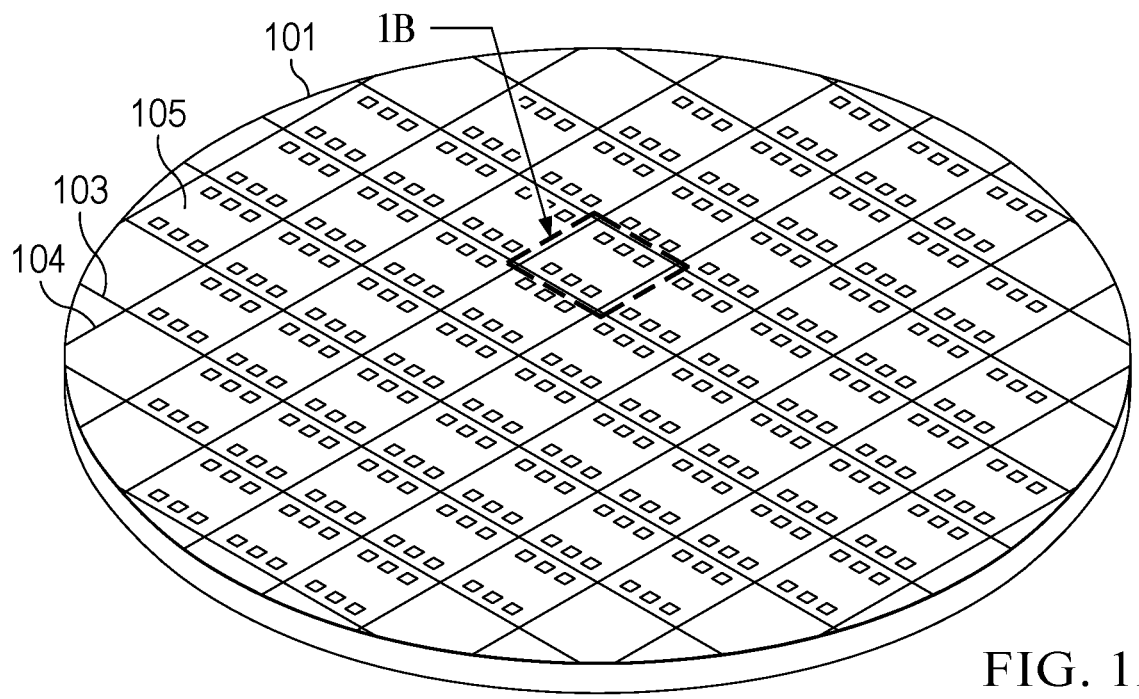
FIGS. 1A-1B illustrate, in a projection view and a close up projection view, respectively, semiconductor dies on a semiconductor wafer, and an individual semiconductor die from the semiconductor wafer for use with the arrangements.

Corresponding numerals and symbols in the different figures generally refer to corresponding parts, unless otherwise indicated. The figures are not necessarily drawn to scale.

Elements are described herein as "coupled." The term "coupled" includes elements that are directly connected and elements that are indirectly connected, and elements that are electrically connected even with intervening elements or wires are coupled.

The term "semiconductor die" is used herein. A semiconductor die can be a discrete semiconductor device such as a bipolar transistor, a few discrete devices such as a pair of power FET switches fabricated together on a single semiconductor die, or a semiconductor die can be an integrated circuit with multiple semiconductor devices such as the multiple capacitors in an A/D converter. The semiconductor die can include passive devices such as resistors, inductors, filters, sensors, or active devices such as transistors. The semiconductor die can be an integrated circuit with hundreds or thousands of transistors coupled to form a functional circuit, for example a microprocessor or memory device.

The term "semiconductor device package" is used herein. A semiconductor device package has at least one semiconductor die electrically coupled to terminals, and has a package body that protects and covers the semiconductor die. The semiconductor device package can include additional elements. Passive components such as sensors, antennas, capacitors, coils, inductors, and resistors can be included. In some arrangements, multiple semiconductor dies can be packaged together. For example, a power metal oxide semiconductor (MOS) field effect transistor (FET) semiconductor die and a logic semiconductor die (such as a gate driver die or a FET controller die) can be packaged together to from a single semiconductor device package. The semiconductor die is/are mounted to a package substrate that provides conductive leads. A portion of the conductive leads form external leads for the packaged device. The semiconductor die in example arrangements is mounted to the package substrate with a device side surface facing away from the substrate and a backside surface facing and mounted to the package substrate. In wire bonded semiconductor device packages used in the arrangements, bond wires or ribbon bonds couple conductive leads of a package substrate to bond pads on the semiconductor die. The semiconductor device package can have a package body formed by a thermoset epoxy resin in a molding process, or by the use of epoxy, plastics, or resins that are liquid at room temperature and are subsequently cured. The package body may provide a hermetic package for the packaged device. The package body may be formed in a mold using an encapsulation process, however, a portion of the leads of the package substrate are not covered during encapsulation, these exposed lead portions provide the external leads for the semiconductor device package. In an alternative package type, the leads are coextensive with the package body to form a "no-leads" package such as a quad flat no-leads ("QFN") package.

The term "package substrate" is used herein. A package substrate is a substrate arranged to receive a semiconductor die and to support the semiconductor die in a completed semiconductor device package. Package substrates can include conductive leadframes, which can be formed from copper, aluminum, stainless steel, steel and alloys such as Alloy 42 and copper alloys. In the arrangements, leadframes are premolded to include a dielectric die support in a central portion. Conductive leads arranged around the dielectric die support are configured for coupling to bond pads on the semiconductor die. The electrical connections from the bond pads to the leads are formed using wire bonds, ribbon bonds, or other conductors. The leadframes can be provided in strips, grids or arrays. The conductive leadframes can be provided as a panel or grid with strips or arrays of unit leadframe portions in rows and columns. Semiconductor dies can be placed on respective unit device leadframe portions within the strips or arrays. A semiconductor die can be placed on a dielectric die support or each unit leadframe device, and die attach or die adhesive can be used to mount the semiconductor dies to the dielectric die supports. In wire bonded packages, bond wires can couple bond pads on the semiconductor dies to the leads of the corresponding unit leadframes. The leadframe leads may have plated portions in areas designated for wire bonding, for example silver plating can be used. After the bond wires are in place, a portion of the leads from the leadframes, the semiconductor die, and the dielectric die support can be covered with a protective material such as a mold compound. The molded semiconductor device packages can be cut apart to complete the processing by singulating the devices from the leadframe strip.

In packaging semiconductor devices, mold compound may be used to partially cover a package substrate, to cover components, to cover a semiconductor die or multiple semiconductor dies, and to cover the electrical connections from the semiconductor die or dies to the package substrate. This molding process can be referred to as an "encapsulation" process, although some portions of the package substrates are not covered in the mold compound during encapsulation. For example, in the arrangements portions of the leads are left exposed from the mold compound. Encapsulation is often a compressive molding process, where thermoset mold compound such as resin epoxy can be used. Mold compound used in electronic packaging is sometimes referred to as "EMC" or "epoxy mold compound." A room temperature solid or powder mold compound can be heated to a liquid state, and then transfer molding can be performed by pressing the liquid mold compound into a mold through runners or channels. Unit molds shaped to surround an individual device may be used, or block molding may be used. The molding process forms multiple packages simultaneously for several devices. The devices to be molded can be provided in an array or matrix of several, hundreds or even thousands of devices in rows and columns on a leadframe strip. The semiconductor devices can then be molded at the same time to increase throughput.

After molding, the individual packaged semiconductor devices are cut from one another in a sawing operation by cutting through the mold compound and package substrate in saw streets defined between the molded semiconductor devices. In leaded semiconductor device packages, portion of the leads extend outside of the package body formed by the mold compound to form external terminals for solder mounting. The leads can be formed to have feet or bottom surfaces arranged for a solder operation, such as a solder reflow operation, to form physical connection and electrical coupling of the packaged device to a printed circuit board or module.

The term "scribe lane" is used herein. A scribe lane is a portion of semiconductor wafer between semiconductor dies. Sometimes the term "scribe street" is used. Once semiconductor processing is completed and the semiconductor devices are complete, the semiconductor devices are separated into individual semiconductor dies by severing the semiconductor wafer along the scribe lanes. The separated dies can then be removed and handled individually for further processing. This process of removing dies from a wafer is referred to as "singulation" or sometimes referred to as "dicing." Scribe lanes are arranged on four sides of semiconductor dies and when the dies are singulated from one another, rectangular semiconductor dies are formed.

The term "saw street" is used herein. A saw street is an area defined between molded electronic devices used to allow a saw, such as a mechanical blade, laser or other cutting tool to pass between the molded electronic devices to separate the devices from one another. This process is another form of singulation. When the molded electronic devices are provided in a strip with one device adjacent another device along the strip, the saw streets are parallel and normal to the length of the strip. When the molded electronic devices are provided in an array of devices in rows and columns, the saw streets include two groups of parallel saw streets, the two groups are normal to each other and the saw will traverse the molded electronic devices in two different directions to cut apart the packaged electronic devices from one another in the array.

In the arrangements, a semiconductor device package includes a semiconductor die mounted to a package substrate having a dielectric die support. In an example, the package substrate can be a leadframe that has a central lead and may be similar to a chip-on-lead leadframe. In an alternative arrangement the central lead is not present. The leadframe has a device side surface and a board side surface opposite the device side surface. The leadframe is partially premolded in a manufacturing operation to form dielectric die supports using a dielectric material. In an example process, epoxy mold compound (EMC) is used to form the dielectric die supports. In an example the EMC partially covers a central lead of the leadframe that is disposed in the center portion of the leadframe. A semiconductor die is mounted on the dielectric die support using die attach epoxy or die attach film. Wire bonds or ribbon bonds are formed using wire bonding operation and bond wires to eclectically couple the bond pads on a device side surface of the semiconductor die to leads of the leadframe. A second molding operation covers the semiconductor die, the die pad, the bond wires, and portions of the leads with a mold compound or other dielectric to form a package body, while portions of the leads are not covered and extend from the molded package body. Because, in the arrangements, the semiconductor die is mounted to a dielectric die support, the wire bonding operation can form reliable wire bonds using standard mechanical bonding pressure and ultrasonic energies, and the location of the bond pads, the semiconductor die size, and the leadframe lead positions can be flexible. By use of the arrangements, the semiconductor die is mechanically supported during wire bonding and other processes so that the size and position of the leads and the semiconductor die are flexible. In addition, use of the partially premolded leadframe of the arrangements allows for use of die attach epoxy to mount the semiconductor dies, which is lower in cost than die attach film that is otherwise required for COL packages. Alternatively die attach film can be used in the arrangements. All of the processes used in forming the semiconductor device packages of the arrangements are low in cost, use existing materials and known processes, and by use of the arrangements, reliable wire bonds are assured. The materials used in the arrangements and the processing steps used do not require modifications to the existing packaging processes, resulting in increased reliability at low costs.

The semiconductor dies used in the arrangements can be, in an example, a switching power converter device. Switching power converters can be used for DC-DC power converters, which are increasingly used for portable and battery powered devices, and for use in automotive and vehicular systems where the primary electric power is a battery at one voltage, and a subsystem requires a different DC voltage. The semiconductor die can be provided as multiple semiconductor dies or as multiple components mounted to the package substrate, to form a system. For example, a power FET semiconductor die and a power FET gate driver semiconductor die can be mounted as separate semiconductor dies on a leadframe. Additional passive components can be mounted to the package substrate or leadframe. In one example, gate drivers for power FET devices can be used in the arrangements in a low pin count small package, such as a SOT-SC70, another SOT type package or an SOIC package. In alternative applications, other package types can be used with the arrangements.

Figure 1B:
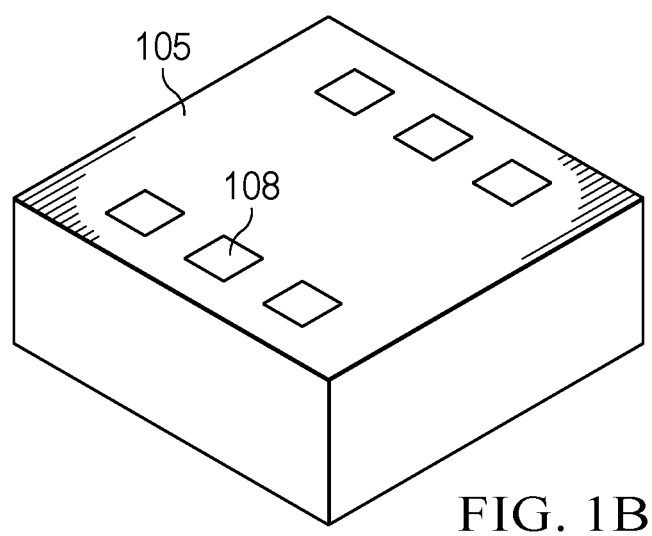

FIGS. 1A and 1B illustrate in projection views a semiconductor wafer 101 having semiconductor devices formed on it (FIG. 1A), and an individual semiconductor die 105 from the wafer for wire bonding and face up mounting (FIG. 1B), respectively. In FIG. 1A, a semiconductor wafer 101 is shown with an array of semiconductor dies 105 formed in rows and columns on a device side surface. The semiconductor dies 105 can be formed using processes typically used in a semiconductor manufacturing facility, including ion implantation, substrate doping, thermal anneals, oxidation, dielectric and metal deposition, sputter, photolithography, pattern, etch, strip, chemical mechanical polishing (CMP), electroplating, and other processes for making semiconductor devices on wafers. Scribe lanes 103 and 104, which are perpendicular to one another and which run in parallel groups across the wafer 101, separate the rows and columns of the completed semiconductor dies 105, and provide areas for dicing the semiconductor wafer 101 so as to separate the semiconductor dies 105 from one another.

FIG. 1B illustrates a single semiconductor die 105, with bond pads 108, which are conductive pads that are electrically coupled to devices (not shown) formed in the semiconductor die 105. After the semiconductor dies 105 are completed, the semiconductor dies 105 are then separated by dicing, or are singulated, along the scribe lanes 103, 104 (see FIG. 1A). Mechanical cutting, laser dicing, plasma dicing, or a combination, can be used for singulation.

Figure 2A:
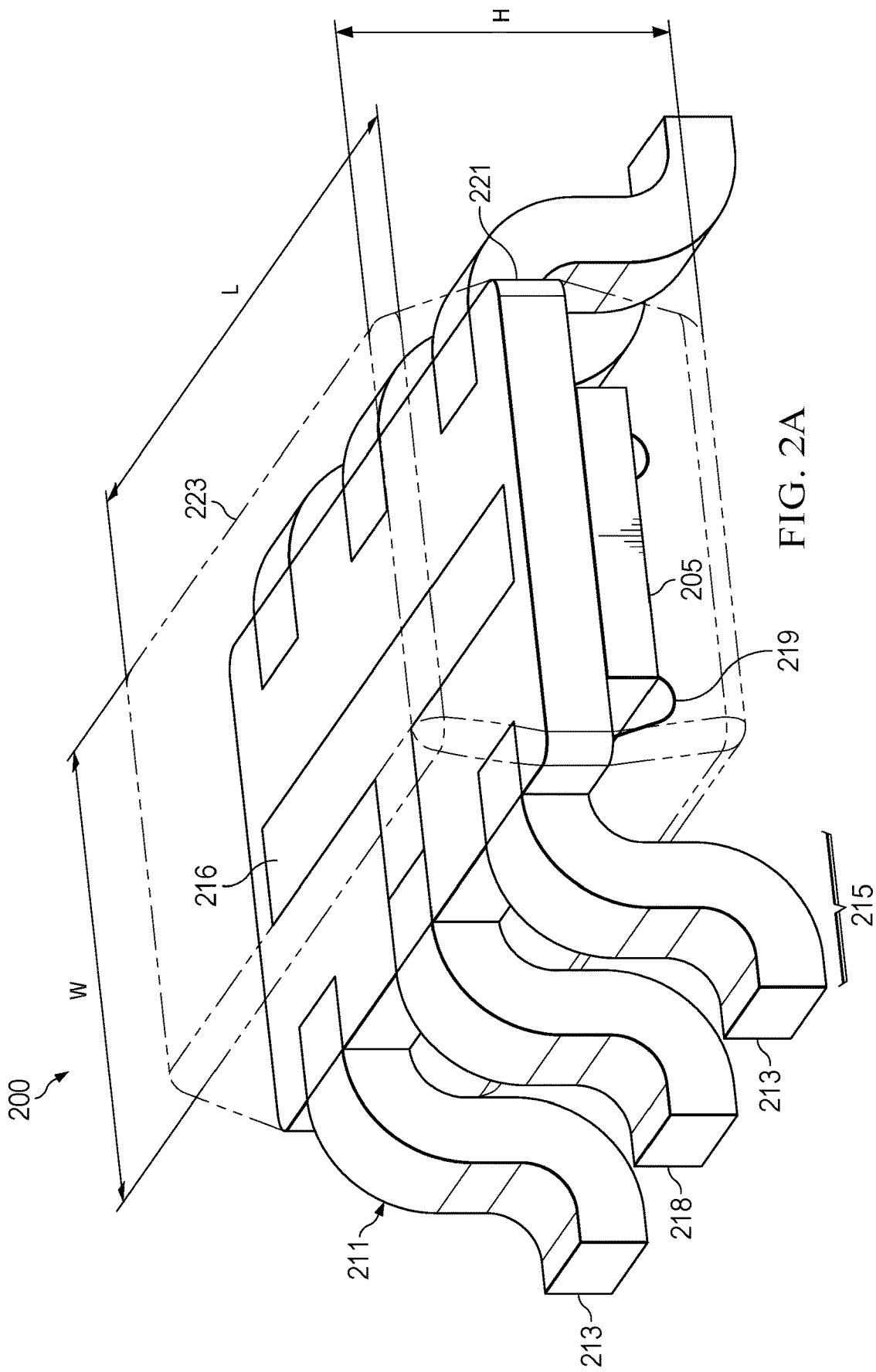
FIG. 2A-2C illustrate, in a projection view, a top view, and a bottom view, respectively, details of a semiconductor device package of an arrangement.

FIG. 2A illustrates in a projection view a semiconductor device package 200 that is useful with the arrangements. In the illustrated example, a small outline transistor (SOT) package is shown. Other leaded semiconductor packages can be used, and alternatively, no-lead packages such as quad flat no lead or "QFN" packages can be used. In particular example arrangements, small outline package (SOP) and small outline integrated circuit (SOIC) package types can be used. To reduce size and volume of systems formed using semiconductor devices, reduction in semiconductor package sizes are continuously desired.

Semiconductor device package 200 includes a semiconductor die 205, bond wires 219 coupling the semiconductor die 205 to leads 213 of the leadframe 211, mold compound 223 covering the semiconductor die 205 and portions of the leadframe 211, and feet portions 215 of the external parts of leads 213, forming areas for solder mounting of the semiconductor device package 200. A dielectric die support 221 supports the semiconductor die 205 and contacts portions of the leadframe 211. In the example, the semiconductor device package 200 has a width "W" of about 1.25 millimeters and ranging from 1.10 to 1.40 millimeters, a length "L" of about 2.0 millimeters and ranging from 1.85 to 2.15 millimeters, and a height "H" of about 0.95 millimeters and ranging from 0.80 to 1.10 millimeters. Other package types with more or fewer leads 213 can be used. Other packages used in alternative arrangements can have greater or smaller dimensions W, L and H.

In FIG. 2A, the semiconductor die 205 is mounted on the board side surface of the leadframe 211. In an alternative arrangement, the semiconductor die 205 could be mounted on the opposite surface (top surface as the leadframe 211 is oriented in FIG. 2A).

Figure 2B:
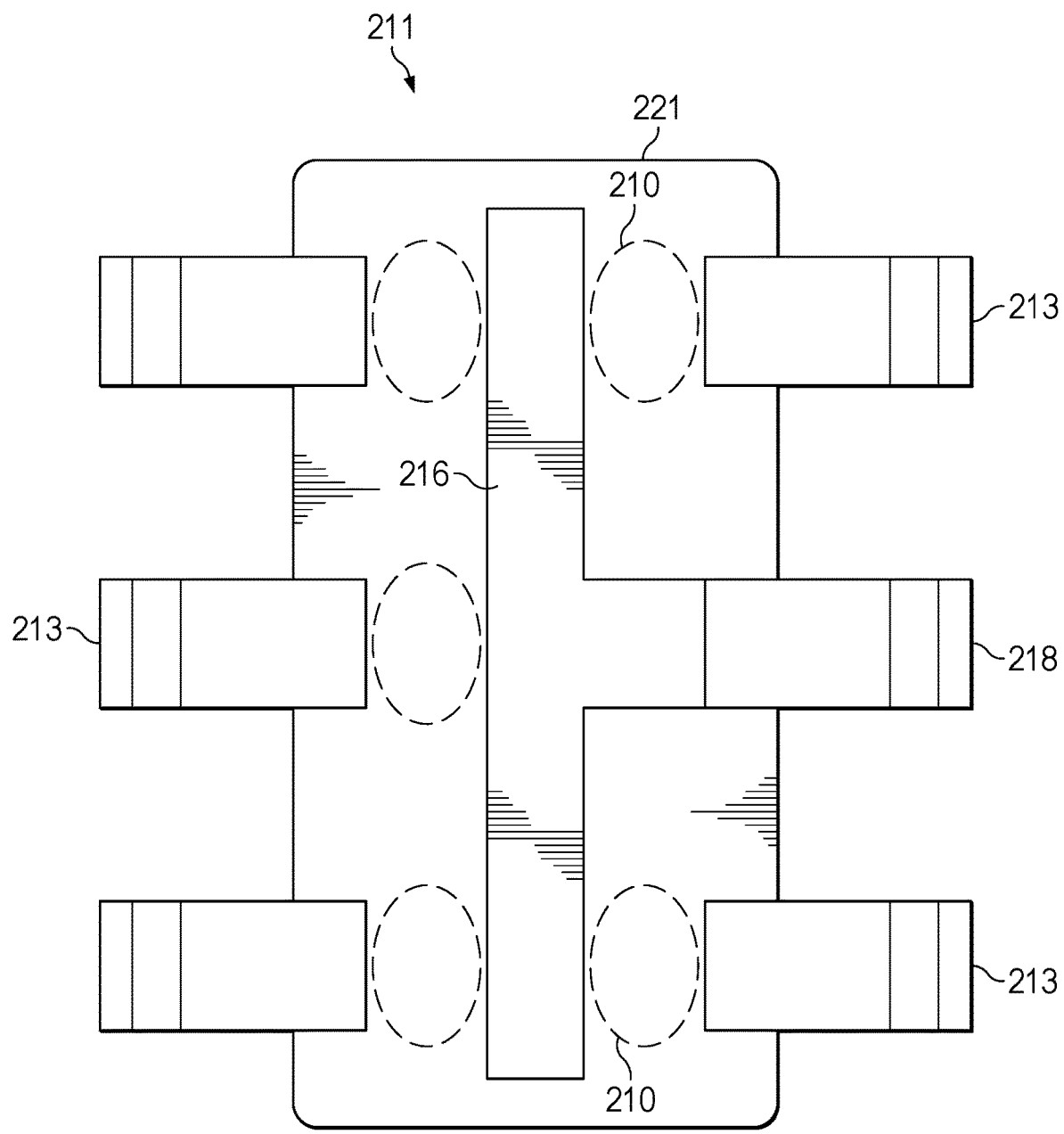

FIG. 2B illustrates, in a top view, the leadframe 211 to show additional detail. The leads 213 have ends that are encapsulated by the dielectric die support 221 and are spaced from the central lead 216 by a spacing 210. This spacing is large enough so that when a semiconductor die is mounted to the dielectric die support 221, the semiconductor die does not contact the leads 213. The central lead 216 is perpendicular to the leads 213 and is connected to lead 218, which extends in parallel to leads 213 and provides an external connection to the central lead 216, which can be connected to ground or another potential.

Figure 2C:
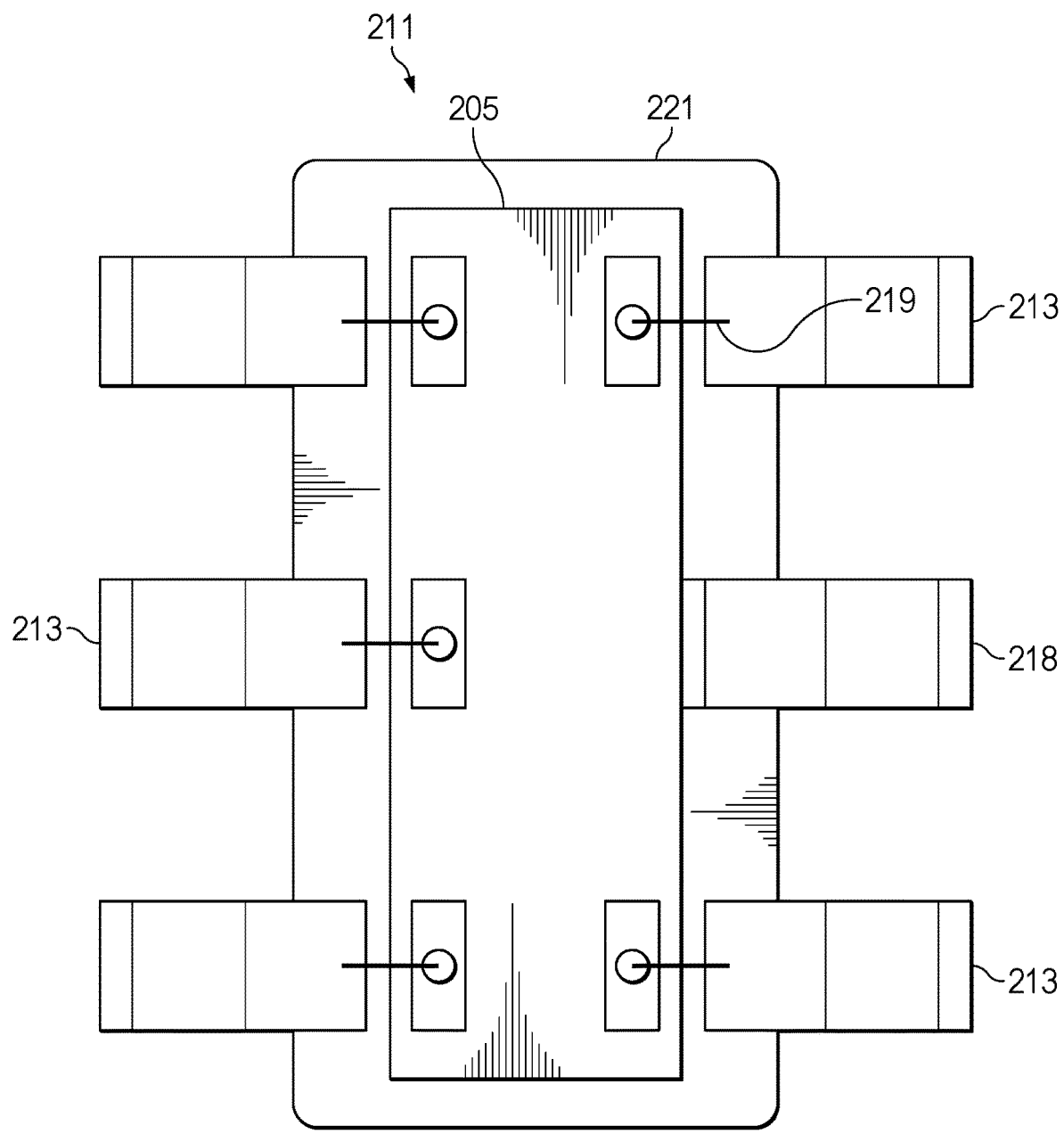

FIG. 2C illustrates the leadframe 211 and dielectric die support 221 from a bottom view, and shows semiconductor die 205 mounted to the leadframe 211. The semiconductor die 205 is mounted using die attach epoxy (not visible in FIG. 2C) that electrically couples the backside surface of the semiconductor die 205 to the central lead 216. The semiconductor die 205 has bond pads 208 on the device side surface, and wire bonds 219 couple the bond pads to the leads 213. Lead 218 is coupled to the semiconductor die 205 by the central lead 216, which is connected to lead 218 (see FIG. 2B).

In the arrangements, a semiconductor device package includes the dielectric die support 221 in a central portion of a package substrate, which can be a unit leadframe such as 211. The dielectric die support 221 provides mechanical support for the semiconductor die 205 that is greater in area than the central lead of a conventional COL leadframe. This aspect of the arrangements increases the flexibility of bond pad positions, semiconductor die size and placement, and leadframe designs, allowing for semiconductor dies of reduced area and of various sizes to be mounted in the packages while providing reliable wire bonds using standard wire bonding processes, mechanical pressure and ultrasonic energy. The arrangements can include a central lead as part of the leadframe to allow for thermal and electrical contact to the backside of the semiconductor die 205, alternatively the central lead can be omitted for arrangements using semiconductor dies which do not require it.

FIGS. 3A-3G illustrate, in a series of projection view, selected steps for forming an arrangement. In FIGS. 3A-3G the boards side surface of the leadframe 311 is shown to illustrate the premolding, die mounting, wire bonding and encapsulation steps, however the completed devices are rotated for mounting to a board or module and when mounted are oriented as shown in FIG. 2A.

Figure 3A:
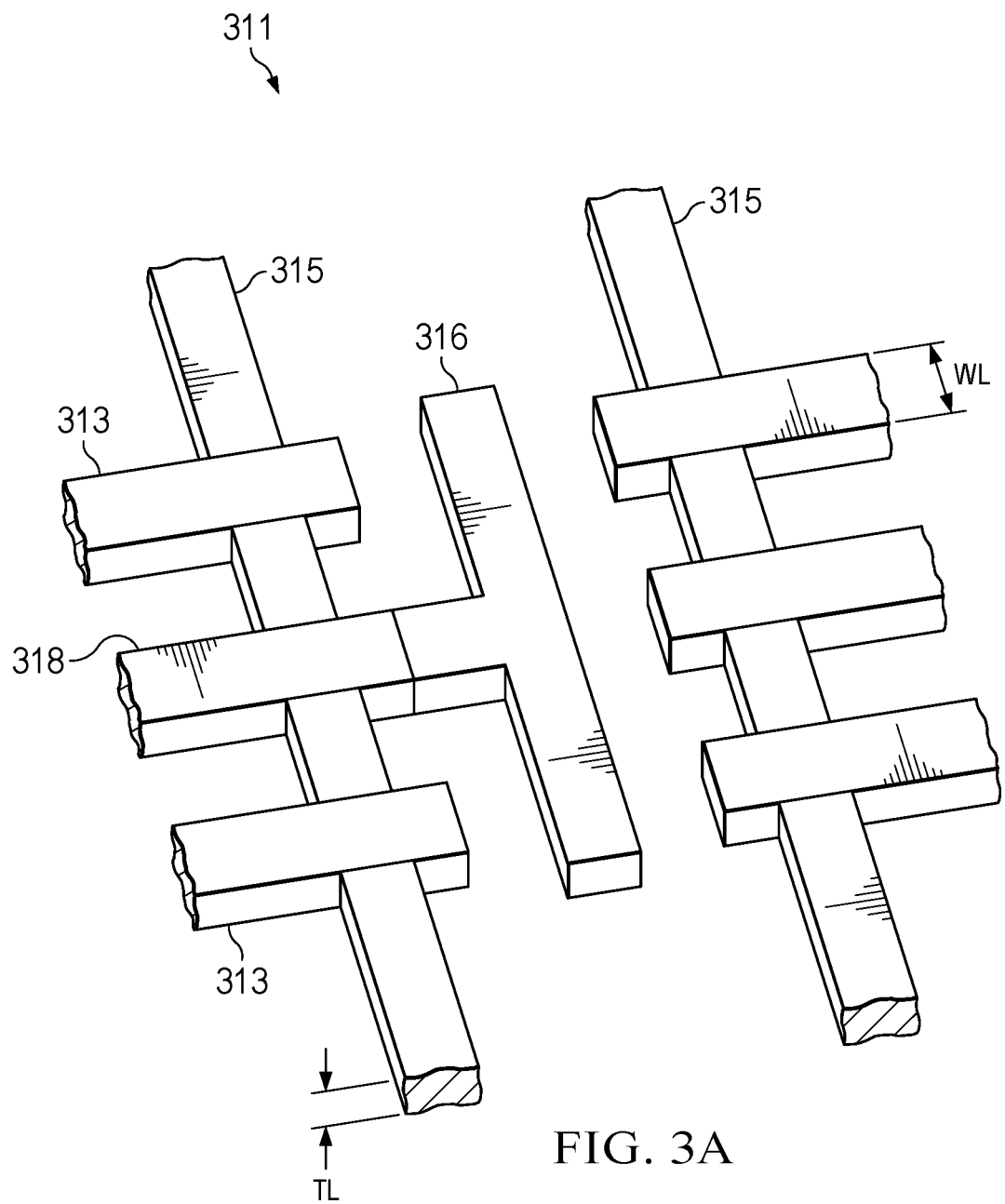
FIGS. 3A-3B, 3BB, and 3C-3G illustrate, in a series of projection views, selected steps for forming semiconductor device packages of the arrangements.

FIG. 3A illustrates in a projection view a unit leadframe 311 for use in an example arrangement. Leads 313 and 318 are shown arranged in parallel to one another and perpendicular to dam bars 315, which tie the leads 313 and 318 together. The dam bars 315 are on opposite sides of a central portion of the unit leadframe 311. In the example of FIG. 3A, a central lead 316 is disposed in the central portion and perpendicular to leads 313, and is coupled to lead 318. The leadframe 311 has leads with a thickness "TL" of about 0.15 millimeters and a range of 0.14-0.16 millimeter thickness, and the leads have a width "WL" of about 0.225 millimeters and a range of 0.15-0.30 millimeters in width. The leadframe 311 can be a copper, steel, stainless steel, Alloy 42, or other conductive material and can be formed in a sheet stamping or etching operation to pattern the leads, dam bars, and central leads. In addition, the leadframe 311 can be spot plated or entirely coated to improve wire bonding and adhesion and to prevent tarnish or corrosion. Example coatings include nickel, gold, palladium, and combinations such as electroless nickel immersion gold (ENIG), and electroless nickel, electroless palladium, immersion gold (ENEPIG) coatings. Spot platings can include silver spot plating.

Figure 3B:
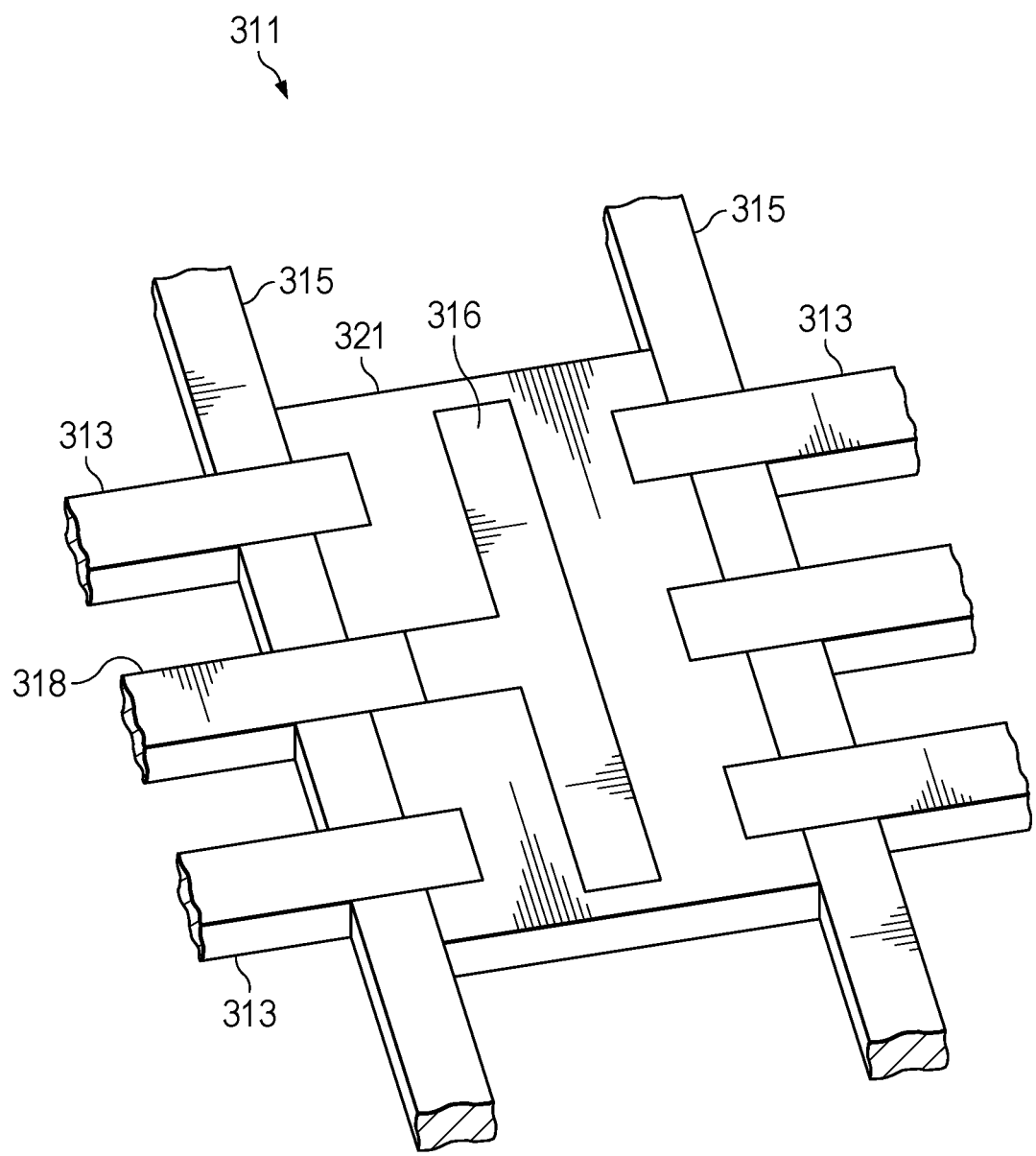
Figure 3B:
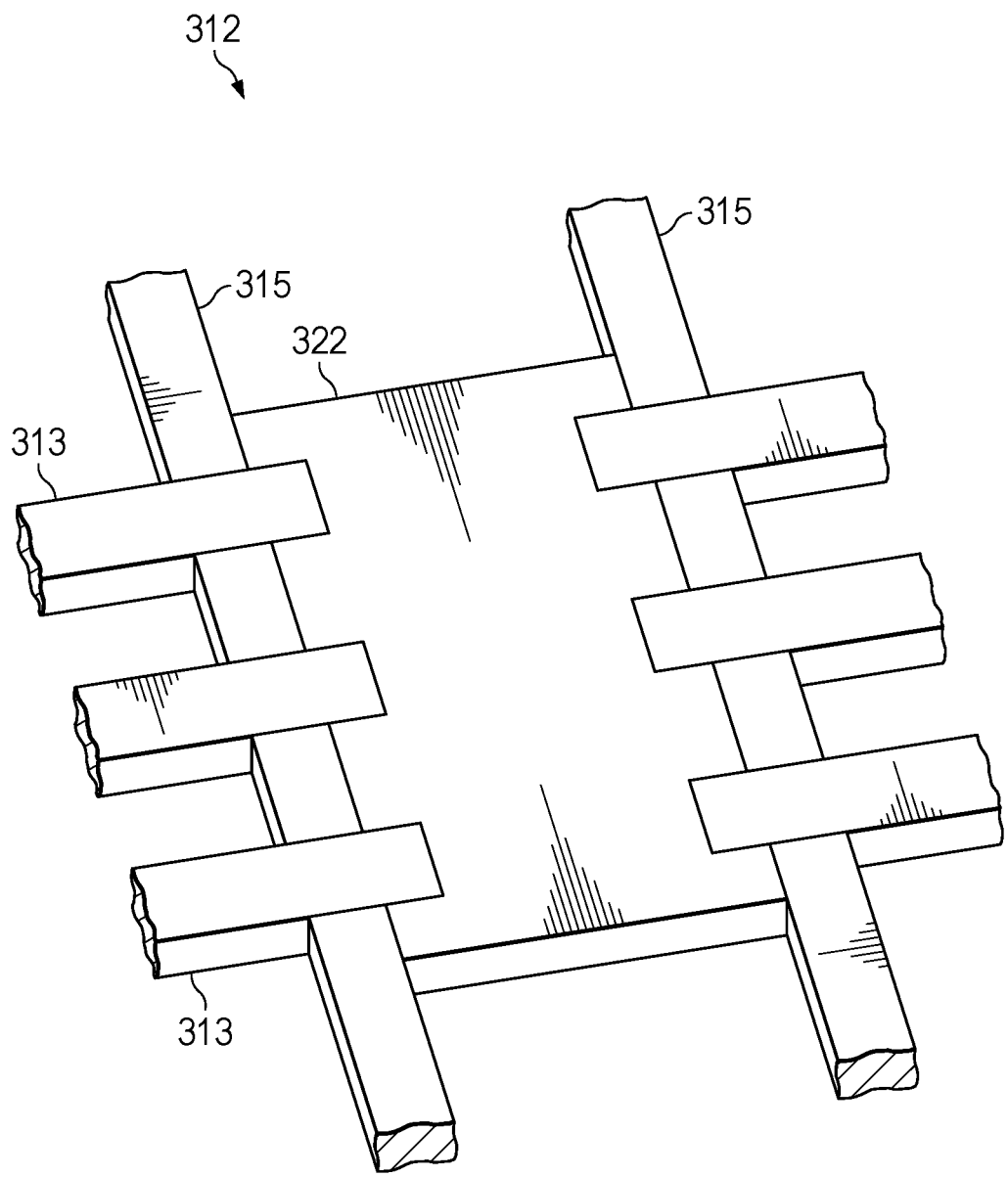

FIG. 3B illustrates the unit leadframe 311 in FIG. 3A after a partial premolding operation forms a dielectric die support 321. The dielectric die support 321 can be formed in a transfer molding operation using epoxy mold compound (EMC). Alternatives to EMC include epoxy, resin, resin epoxy, thermoset and thermoplastic materials. The dielectric die support 321 is contained in the central portion of the unit leadframe 311 by the dam bars 315. While the dam bars 315 in the illustrated example are of the same material as the rest of the leadframe 311, in alternative arrangements tapes or other plastics can be used as dam bar material. The dielectric die support 321 contacts the central lead 316 and the ends of leads 313 and is coplanar with the device side surface of the leads 313, 318 and the central lead 316 to provide a planar die mounting surface for a semiconductor die. The dielectric die support 321 also contacts and supports the interior portions of the leads 313 and lead 318. During the molding process, dam bars 315 contain and restrict the mold compound to the central portion of the leadframe 311 to form dielectric die support 321.

FIG. 3BB illustrates an alternative arrangement for a unit leadframe 312. A dielectric die support 322 is formed in a central portion of the unit leadframe 312 with dam bars 315 bounding the dielectric die support 322. The leads 313 have interior portions that are in contact with and are coplanar with the dielectric die support 322. In contrast to the unit leadframe 311 of FIG. 3B, in FIG. 3BB there is no central lead in the central portion, instead the dielectric die support 322 fills the central portion entirely. For semiconductor dies where no thermal or electrical contact to the backside of the semiconductor die is needed, this arrangement provides the mechanical support to the semiconductor die using the dielectric die support 322 without the central lead (see 316 in FIG. 3B) used in the unit leadframe 311 of FIG. 3B. Either of the unit leadframes 311 or 312 can be used in the subsequent process steps shown in FIG. 3C-3F to form a packaged semiconductor device.

Figure 3C:
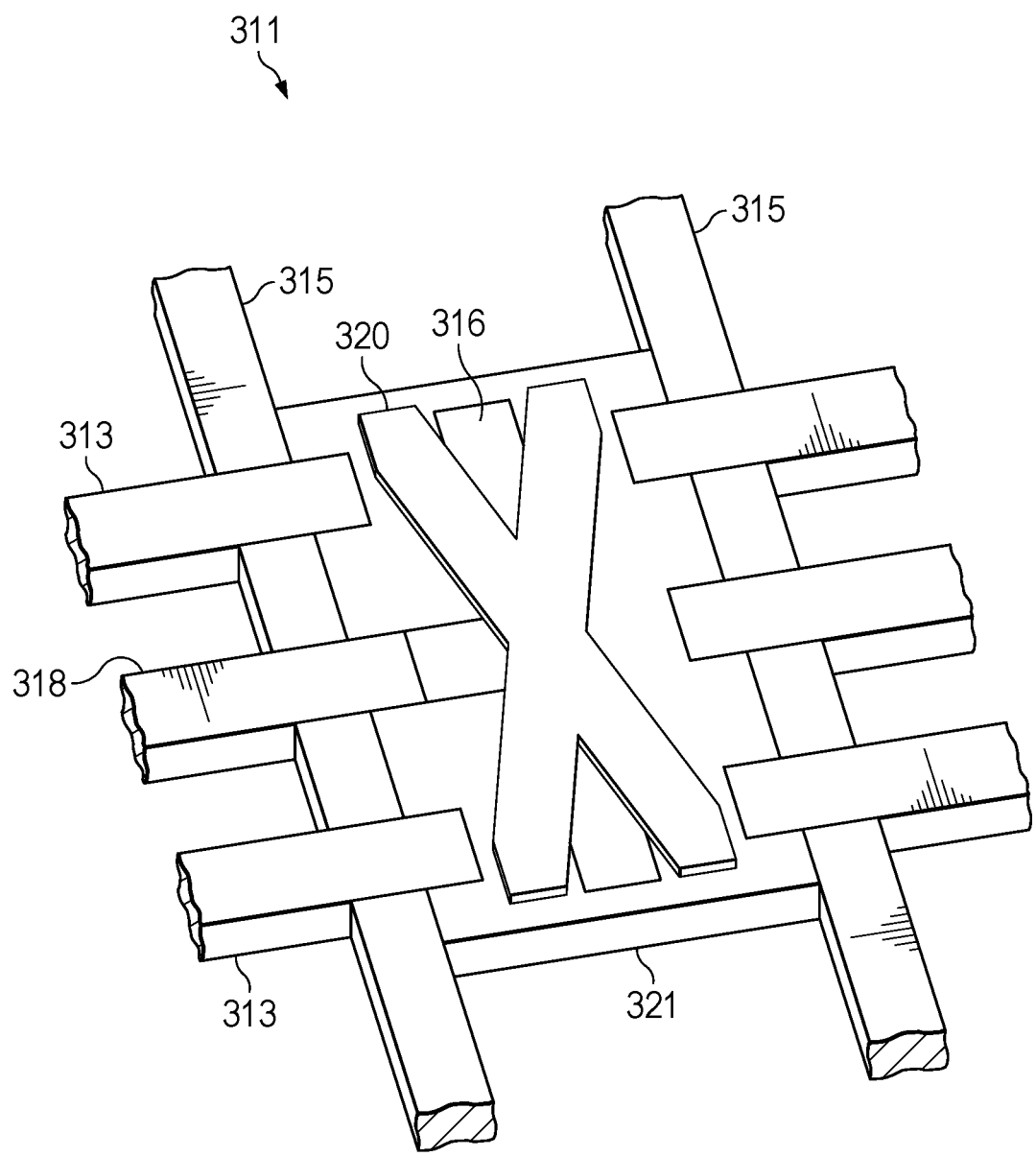

In FIG. 3C, the unit leadframe 311 (alternatively, leadframe 312 can be used) is shown after an additional processing step. A die attach epoxy 320 is deposited on the dielectric die support 321 and is arranged to mount a semiconductor die on the unit leadframe 311. When the central lead (see 316 in FIG. 3B) is used, the die attach epoxy 320 can be a conductive die attach material to make thermal and electrical contact to the central lead 316. The die attach epoxy 320 can be dispensed as a liquid and cured or allowed to cure. The die attach epoxy 320 can be dispensed using a needle dispenser. An inkjet or drop on demand system can be used, or a stencil system can be used. Die attach epoxy is used in the example arrangements, in additional alternative arrangements a die attach film or tape can be used, although die attach epoxy is lower in cost. The die attach epoxy 320 can be deposited in an "X" pattern as shown in FIG. 3C, in alternative processes an oval pattern, a group of dots or other patterns can be used so that when a semiconductor die is mounted, the die attach epoxy 320 can spread and cover the backside surface of the semiconductor die but not spread outside the semiconductor die to other areas of the unit leadframe 311.

Figure 3D:
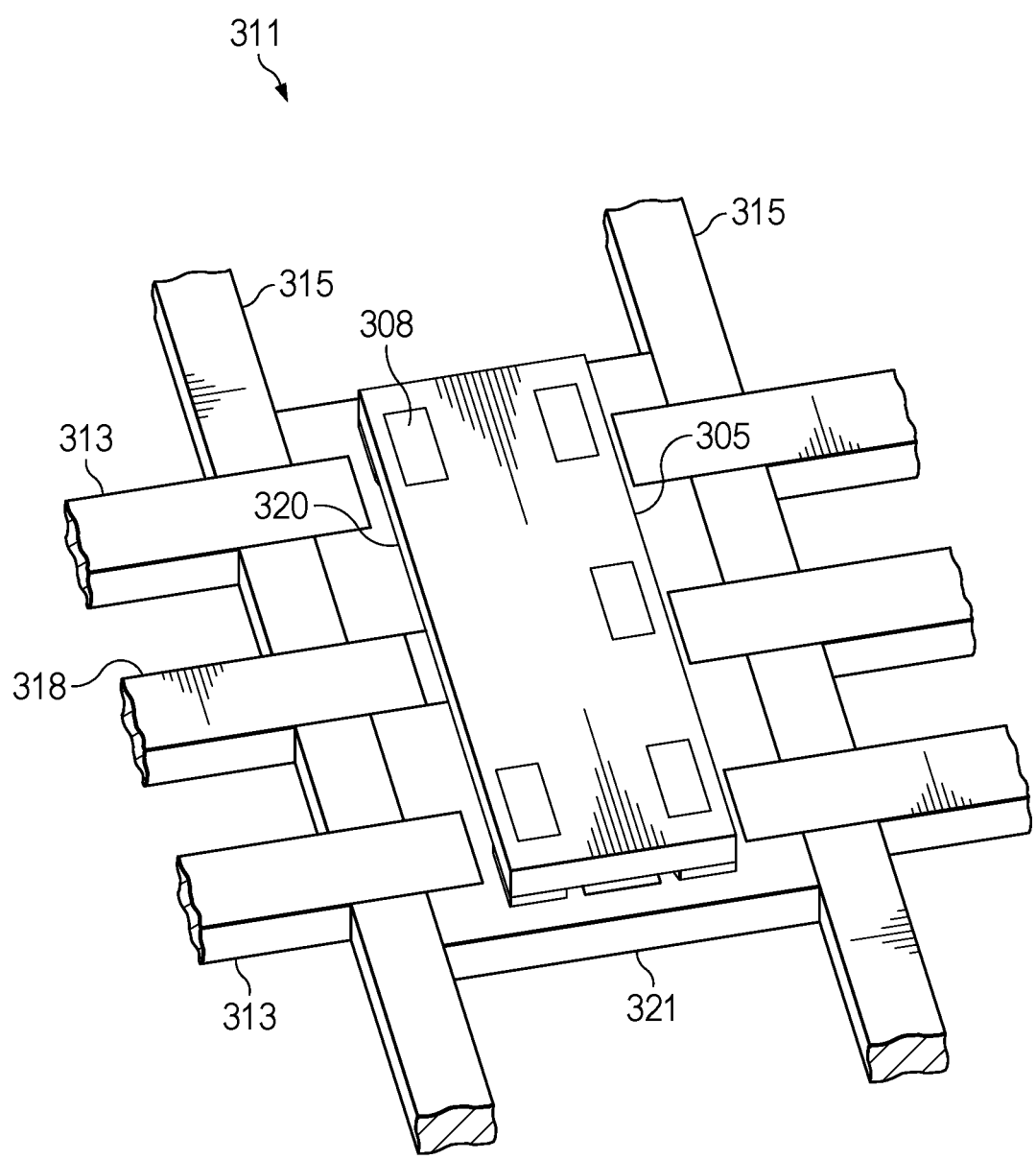

FIG. 3D illustrates the unit leadframe 311 after additional processing. A semiconductor die 305 is shown with a backside surface mounted on the unit leadframe 311 using the die attach epoxy 320 (which is now covered by the semiconductor die 305). The unit leadframe 311 has leads 313, lead 318 and dam bars 315 as shown in FIGS. 3A-3C, and the dielectric die support 321 supports the semiconductor die 305 over the bottom surface of the semiconductor die, so that the semiconductor die 305 is mechanically supported over the entire area of the bottom surface. In an alternative arrangement the unit leadframe 312 can be used (see FIG. 3BB) and no central lead is provided. In this alternative arrangement the semiconductor die is supported by the dielectric die support 322 and interior portions of leads 313. Bondpads 308 are shown on the device side surface of the semiconductor die 305 and facing away from the leadframe 311.

Figure 3E:
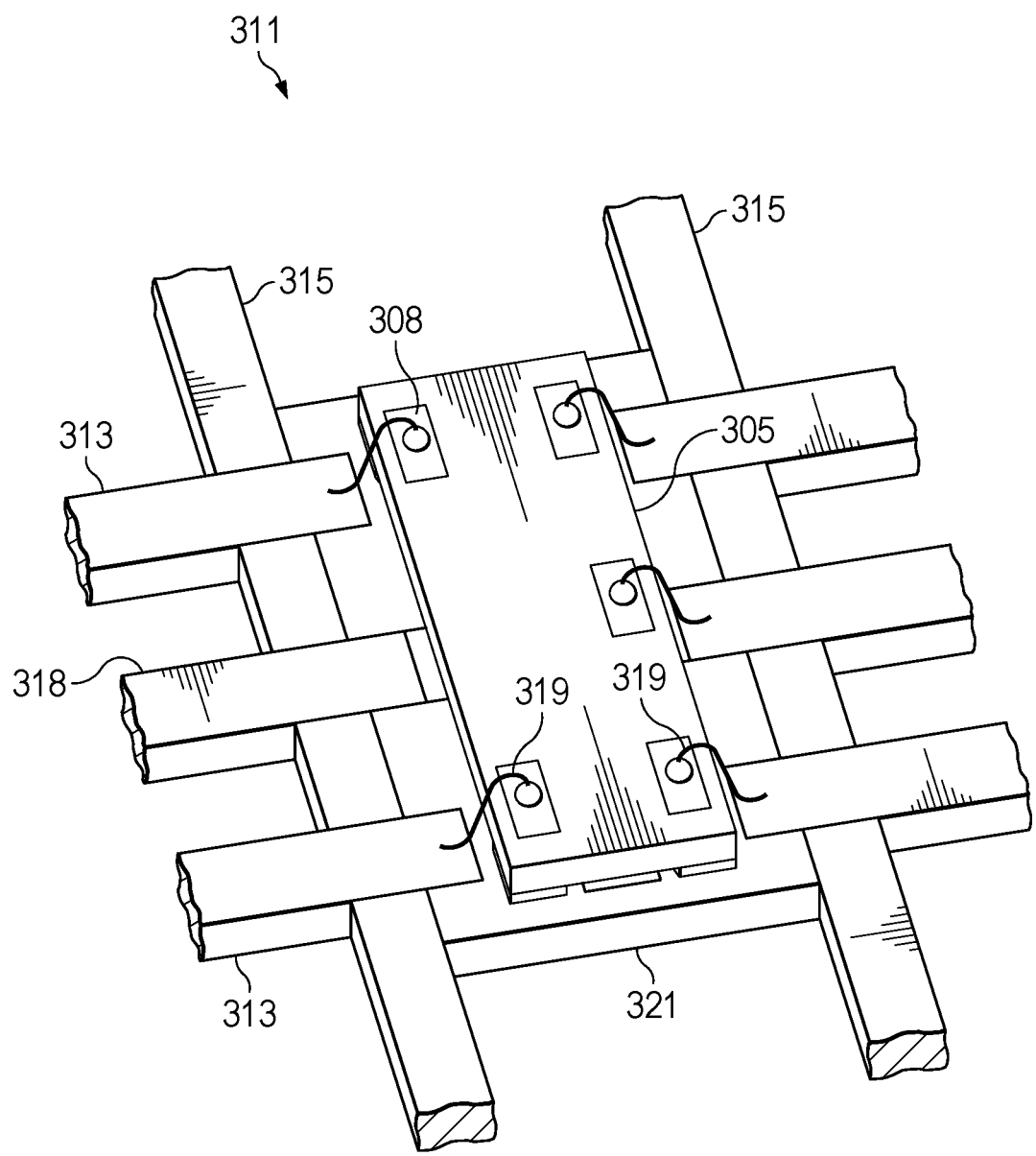

FIG. 3E illustrates the unit leadframe 311 and the semiconductor die 305 of FIG. 3D after additional processing. Wire bond connections 319 are shown between bond pads 308 and the leads 313. The wire bond connections 319 can be made using gold, copper, palladium coated copper, aluminum or silver bond wire. In an example gold wire is used of about 0.025 millimeters in diameter. In a wire bonding operation, a bond wire is allowed to extend through a hole in a capillary of a wire bonding tool. A heat source such as a flame is used to melt the end of the bond wire to form a ball. The ball is then mechanically pressed onto a bond pad and in many examples, ultrasonic energy is applied to create a metal-to-metal bond between the ball on the end of the bond wire and the bond pad. Under bump metallization (UBM) can be applied to the bond pad to increase bondability and adhesion, including nickel, gold, palladium coatings and combinations of these. The bond pads can be formed of metallization material used in semiconductor processes including aluminum and copper bond pads. In an alternative approach, ribbon bonds can be used in place of the wire bonds.

In an example process, after the ball is bonded to a bond pad, the capillary moves over a portion of a conductive lead 313 of the unit leadframe 311 and a stitch bond is formed. The bond wire 319 extends from the ball bond and arcs above the leadframe, and then is pulled down to the lead 313 and the capillary makes a mechanical bond by pressing the wire and again using ultrasonic energy, the wire is cut a short distance from the lead to make the stitch bond on the lead. In an additional alternative, a stitch on ball bond can be used, where a first ball is bonded to the lead, the capillary of the wire bonding tool cuts the wire and then forms a second ball on the semiconductor bond pad. The wire bonding tool then extends the bond wire over the first ball, and the stitch bond is made on the first ball, to increase reliability. This process takes extra time and thus adds costs, but can be used with the arrangements when desired. "Reverse" bonding can also be used, where a ball is first formed on the bond pad, a second ball is formed on the lead and the bond wire extended over the bond pad, and a stitch on ball bond is formed on the first ball on the bond pad.

The lead 318 is coupled to the central lead 316 (see FIG. 3A) and so no bond wire is needed to couple lead 318 to the semiconductor die 305, which is in electrical and thermal contact to the backside surface of the semiconductor die 305. The semiconductor die 305 is mounted to the central lead 316 by die attach epoxy, tape or film that is electrically and thermally conductive. Leads 313 extend towards but do not contact the semiconductor die 305, instead the bond wires 319 make the electrical connections to the semiconductor die 305 at the bond pads 308.

In the arrangements, the dielectric die support 321 in FIG. 3B (or 322 in FIG. 3BB) provides mechanical support for the semiconductor die across the bottom surface, so that in wire bonding, standard process parameters for mechanical pressure and ultrasonic energy can be used, without regards to the location of the bond pads or leads. This is in sharp contrast to prior COL packages formed without use of the arrangements, where a semiconductor die is mounted to a central lead but is unsupported in many areas where bond pads might be located. In wire bonded chip on lead packages formed without use of the arrangements, the bond pads, pad locations, and the lead positions have to be carefully chosen, or in some cases wire bonding process parameters have to be modified, to perform the wire bonding operations and achieve reliable wire bonds. The modifications made to the wire bonding processes on COL packages formed without the arrangements may reduce mechanical pressure and/or ultrasonic energy used to compensate for the unsupported die areas, but this comes at a possible cost of less reliable wire bonding. Use of the arrangements provides mechanical support for the entire area of the semiconductor die while retaining the desired features of a smaller package size, without need for a conventional isolated die pad structure in the leadframe.

Figure 3F:
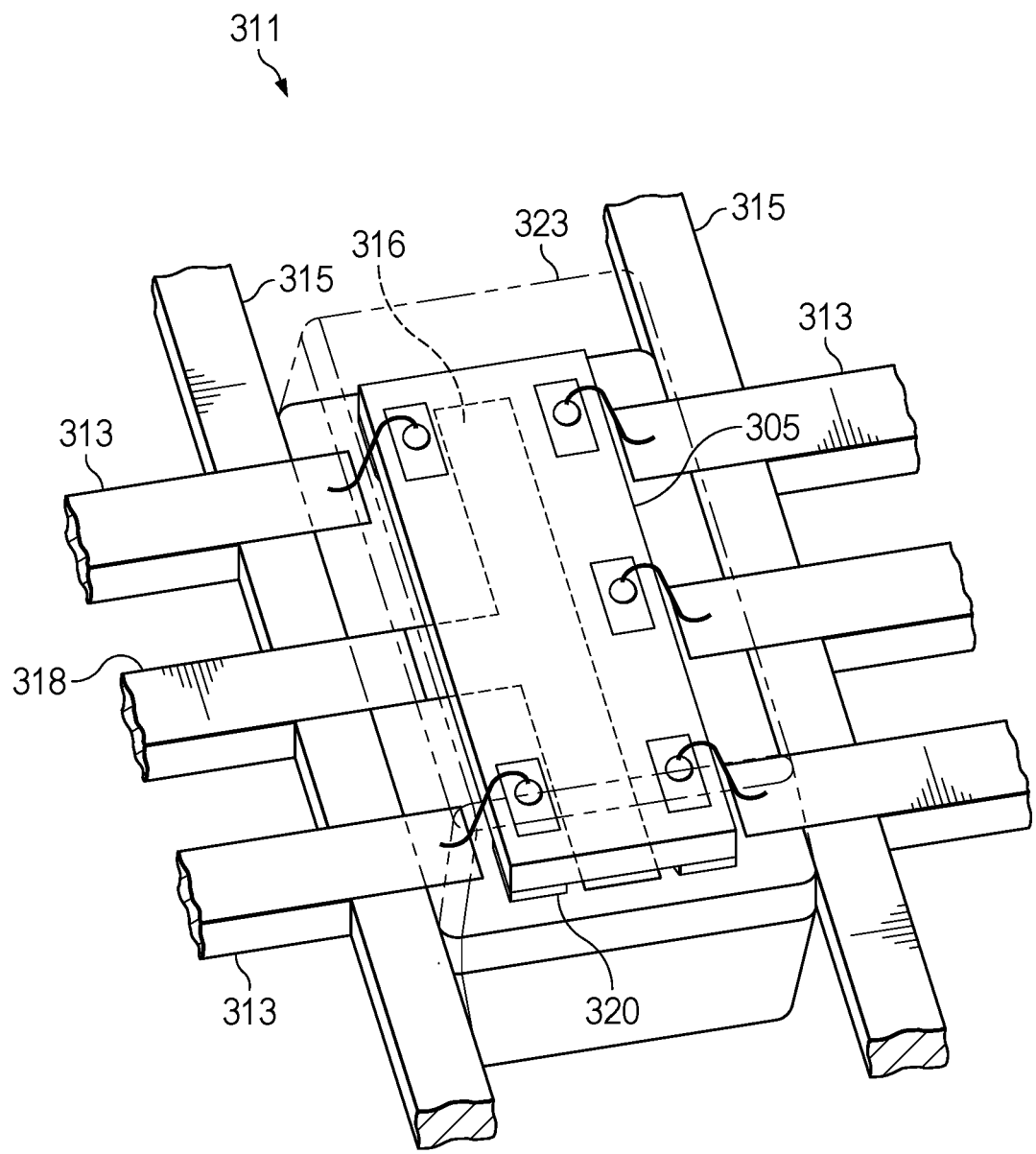

FIG. 3F illustrates unit leadframe 311 of FIG. 3E after additional processing. In FIG. 3F, mold compound 323 is shown covering the semiconductor die 305, the bond wires 319, the dielectric die support 321, and portions of the leads 313 and lead 318. The dam bars 315 bound the mold compound 323 and are exposed from it to enable the dam bars to be removed in a further trim step, described below. Mold compound 323 can be EMC, epoxy, resin, or plastic and forms a package body for a semiconductor device package. The mold compound can be formed in a transfer molding operation using unit or block molding. In the illustrated example, a mold with cavities for unit molding is used, so that the package body is defined by the cavities in the mold tool. The transfer molding process using thermoset mold compound uses heat and pressure. A solid piece of mold compound, or a powder, is placed in a mold tool and heated to a liquid state. Once the mold compound is liquid, it is forced by a mechanical ram that applies mechanical pressure to cause the mold compound to flow through runners into the cavities containing the unit leadframes with the semiconductor dies and bond wires in place. The mold compound fills the cavities and surrounds the semiconductor dies and the bond wires. The mold compound sets and becomes a solid, and the mold is opened and the packaged semiconductor devices are released from the mold tool, although still attached to the leadframe. In addition, unit leadframe 311 can be plated or entirely coated to improve solderability. Example coatings include tin plating. When a bare copper material is used for the leadframe, the leads can be coated with tin after molding. When a palladium plated copper leadframe is used, the tin plating is not needed.

Figure 3G:
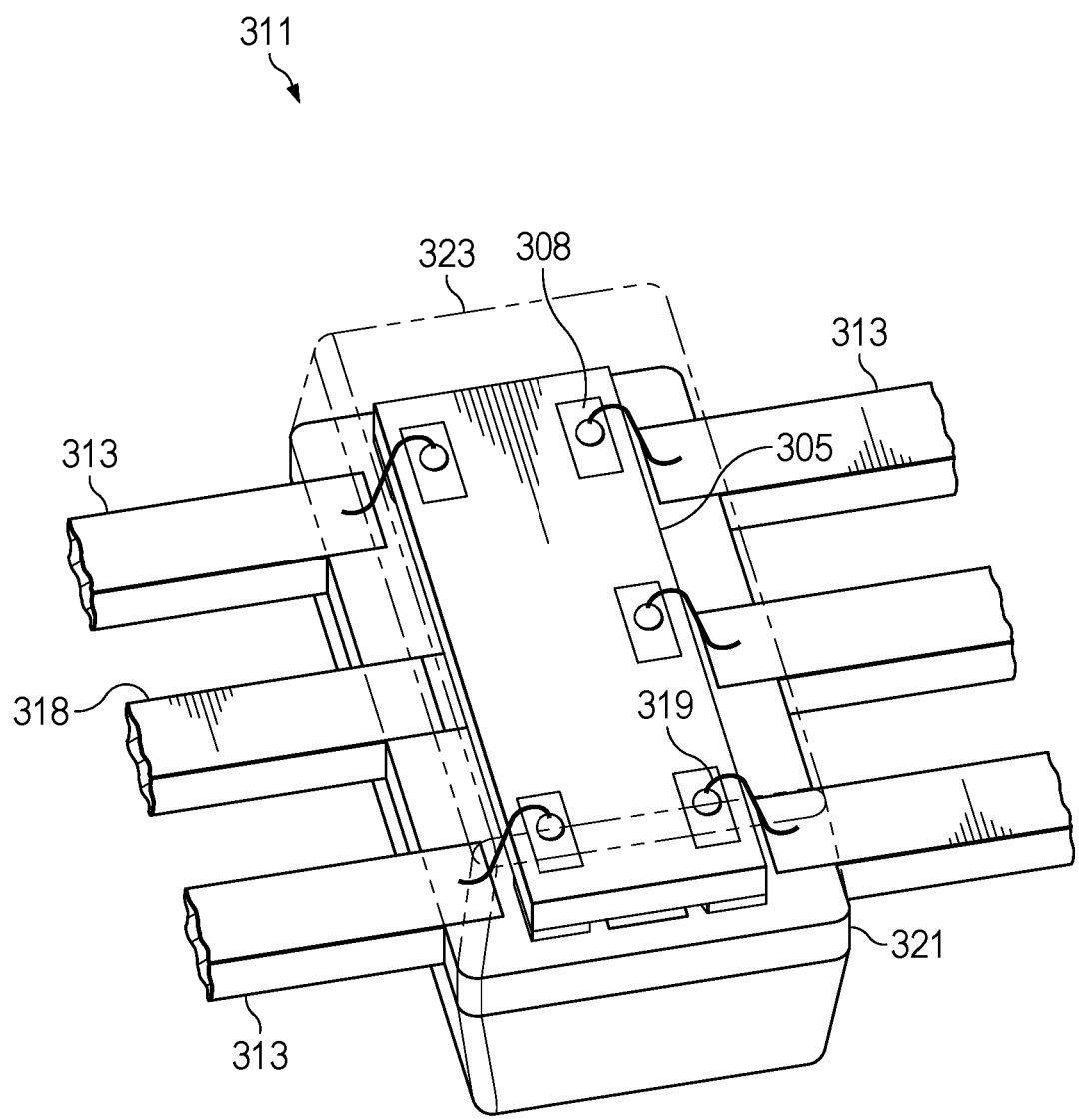

FIG. 3G illustrates, in another projection view, the unit leadframe 311 of FIG. 3F after additional processing. In FIG. 3G the dam bars 315 (see 315 in FIG. 3F, for example) have been removed by a trim process in a trim form tool. The dam bars are removed between the leads 313, 318 and outside the leads 313, 318 to electrically isolate the leads from one another prior to a lead forming step. The trim form tool also removes tie bars (not shown) that support the leads by tying them together, the tie bars are outside the views of FIGS. 3A-3F, but are described further below. The remaining elements including leadframe 311, the semiconductor die 305 with bond pads 308, the bond wires 319, the dielectric die support 321 and mold compound 323 are not changed and remain as shown in FIG. 3E.

After the trim process isolates the leads 313 from one another as shown in FIG. 3G, the leads 313 and 318 are formed to complete the semiconductor package as shown in FIG. 2A (see semiconductor device package 200). The leads have a foot portion (see 215 in FIG. 2A) that can be used to solder mount the packaged semiconductor device to a printed circuit board.

FIGS. 4A-4F illustrate, in a series of views, selected processes for forming multiple packaged semiconductor devices of the arrangements on a leadframe strip. Use of the processes for forming multiple packaged devices simultaneously increases yield and throughput, reducing costs. In FIGS. 4A-4F the leadframe strip is shown with the board side facing upwards for processing including premolding, die attach, wire bonding, encapsulation and trim processes. In FIG. 4G the completed semiconductor devices are shown rotated with the board side facing downwards and oriented as usually placed before being mounted to a circuit board.

Figure 4A:
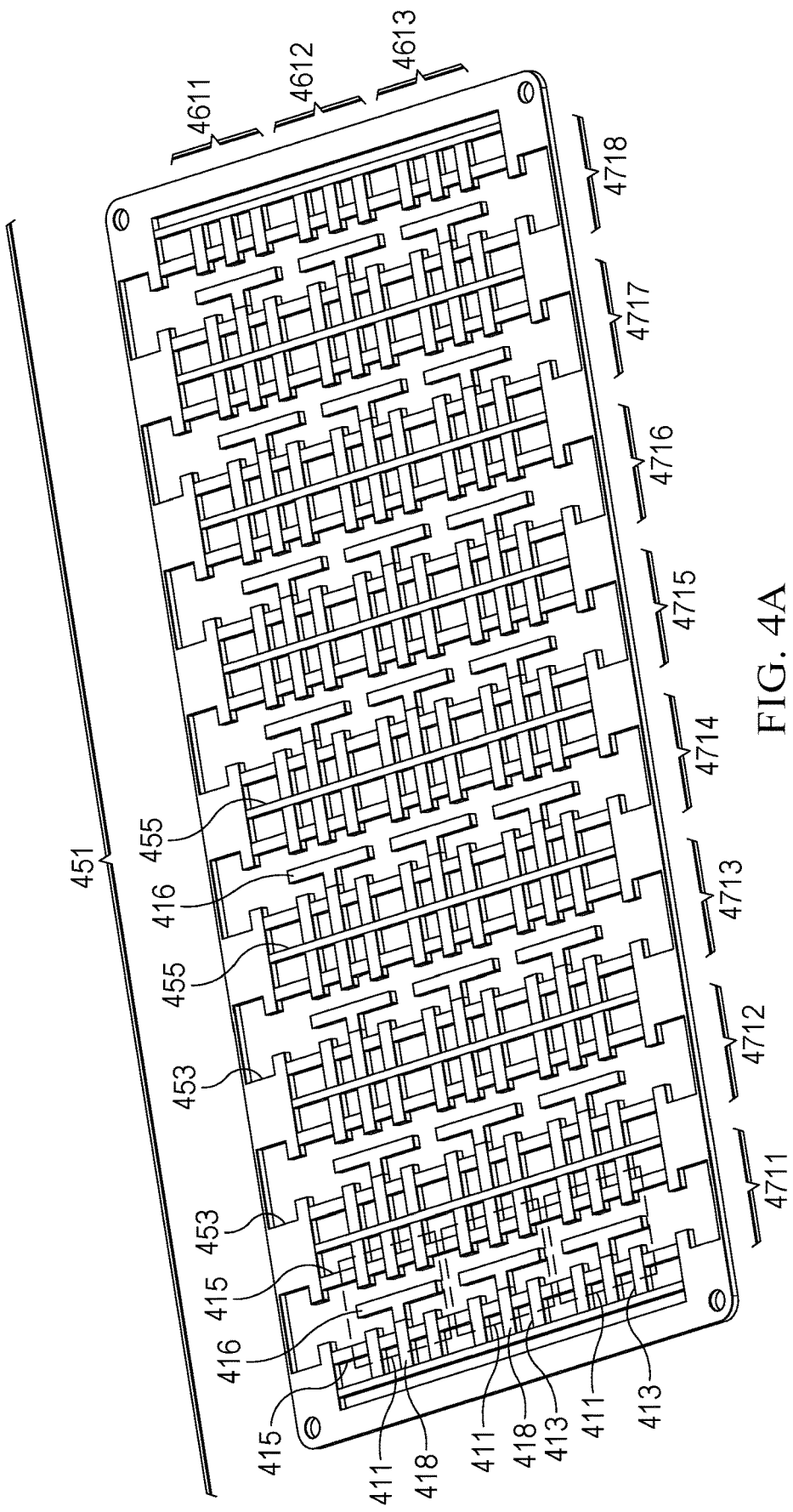
FIGS. 4A-4G illustrate, in a series of views, selected major steps in manufacturing semiconductor device packages using a leadframe strip that can be used in forming the arrangements.

In FIG. 4A, a leadframe strip 451 is shown with unit leadframes 411 spaced apart from one another and formed of the leadframe material, which can be copper, coated copper, stainless steel, steel, Alloy 42, or another conductor. The leadframe strip 451 can be patterned from sheet material in a stamping or etching process. In the example of FIG. 4A, there are three rows of eight unit leadframes 411 labeled 4611, 4612, and 4613, the rows are arranged in columns of three devices labeled 4711, 4712, 4713 . . . 4718. The example leadframe strip 451 therefore has twenty four unit leadframes 411. Each of the unit leadframes 411 has tie bars 455 that couple the leads 413 and 418 to one another and to the leadframe strip 451, and the dam bars 415 that couple the leads together and form barriers to contain mold compound in molding processes. The leadframe 451 includes mold gates 453 that are used in a transfer mold tool to allow the partial premolding process to form the dielectric die supports as described above.

Figure 4B:
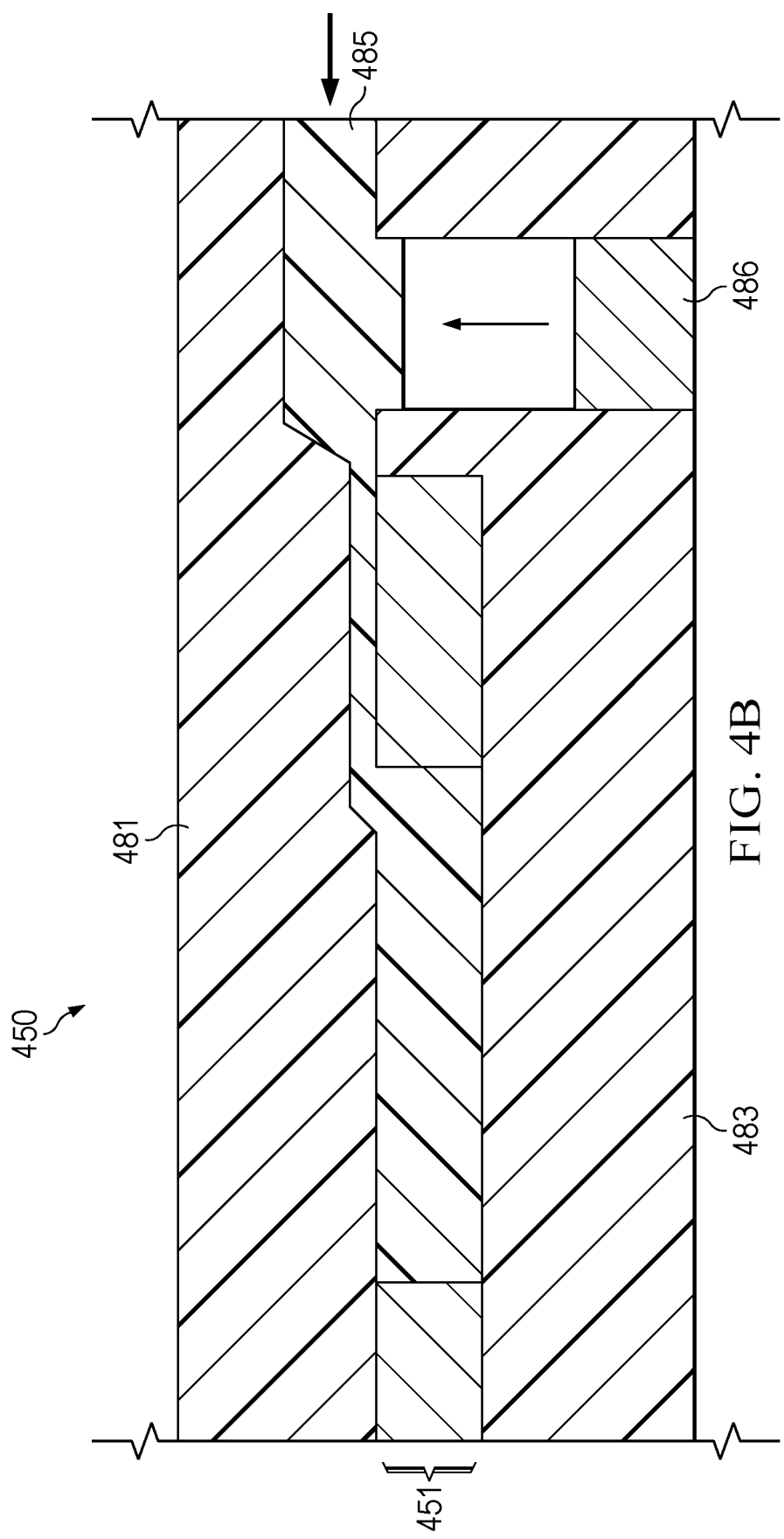

In FIG. 4B, a transfer mold tool 450 is shown in a cross section to illustrate the partial premolding process. Leadframe 451 is shown placed in the transfer mold tool 450 with a top mold chase 481 and a bottom mold chase 483 clamped together and securing the leadframe 451 between the top mold chase 481 and the bottom mold chase 483. A ram 486 is shown moving upwards to force mold compound 485, which has been heated to a liquid state, into runners in the transfer mold. The liquid mold compound 485 flows through mold gates in the leadframe 451 (see mold gates 453 in FIG. 4A) to flow into cavities on either side of the leadframe 451 in the top mold chase 481 and bottom mold chase 483.

Figure 4C:
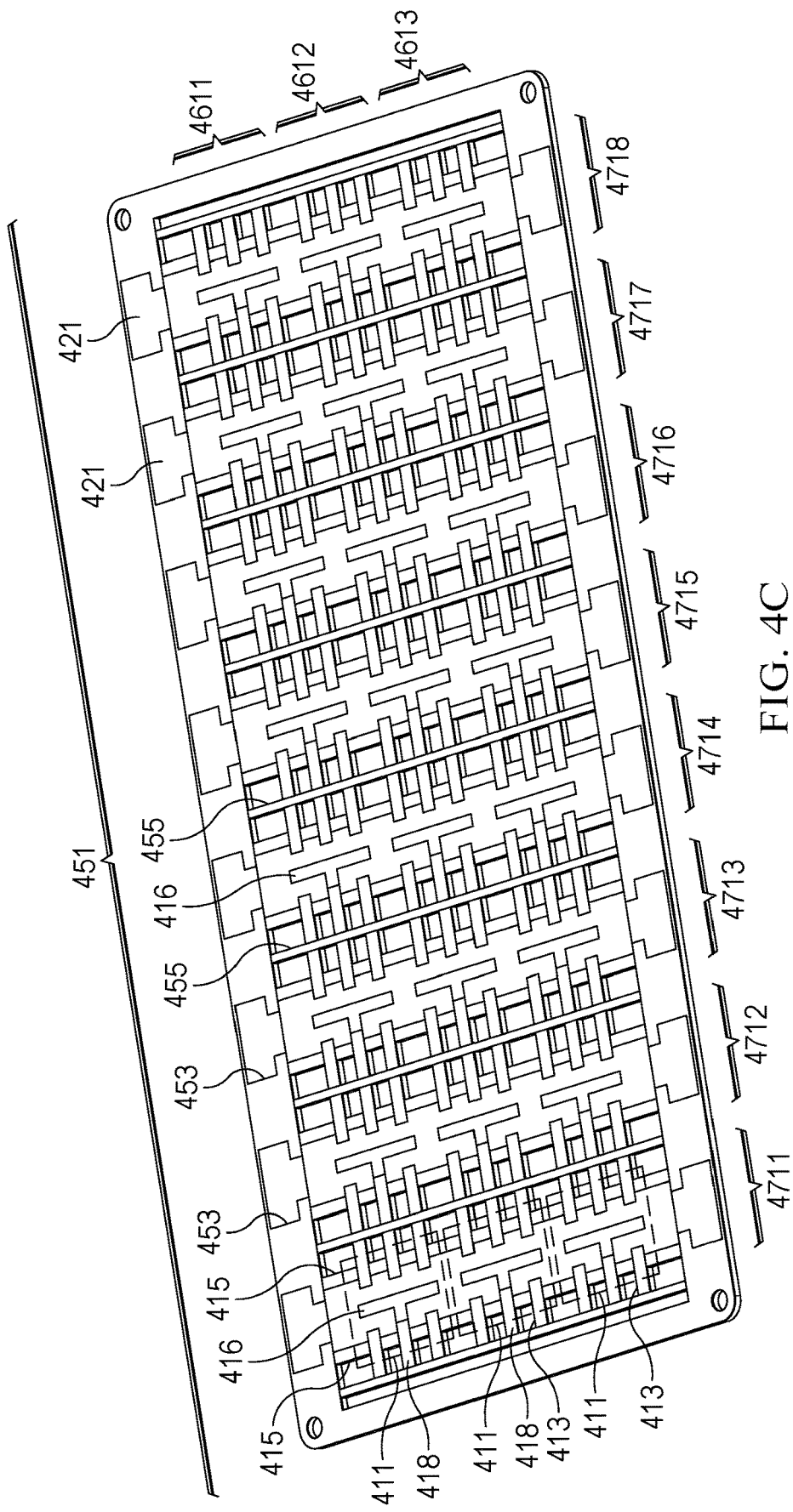

FIG. 4C illustrates the leadframe strip 451 after the partial premolding process forms the dielectric die supports 421 in each column 4711, 4712, 4713, 4714, 4715, 4716, 4717, 4718 of the unit leadframes 411. The dam bars 415 contain the dielectric die supports 421 within the central portions of the unit leadframes 411. Central leads 416 are shown with the dielectric die supports 421 in the central portion of each of the unit leadframes 411. The dielectric die supports 421 can be an EMC that is transfer molded as described above with respect to FIGS. 4B and 4BB. The dielectric die supports 421 fill the spaces between the dam bars 415 and does not fill spaces between the columns of unit leadframes 411. Because the dielectric die supports 421 do not fill all of the open space in the leadframe strip 451, the process is described as a "partial" premold. (Premolded leadframes ("PMLF") conventionally used for semiconductor packaging typically have dielectric formed in all of the open areas.) In contrast, in the arrangements the dielectric die supports 421 are only formed in the central portions of the unit leadframes 411, and is restricted during the molding process by the dam bars 415, so that the leadframe strip 451 can be described as "partially" premolded.

Figure 4D:
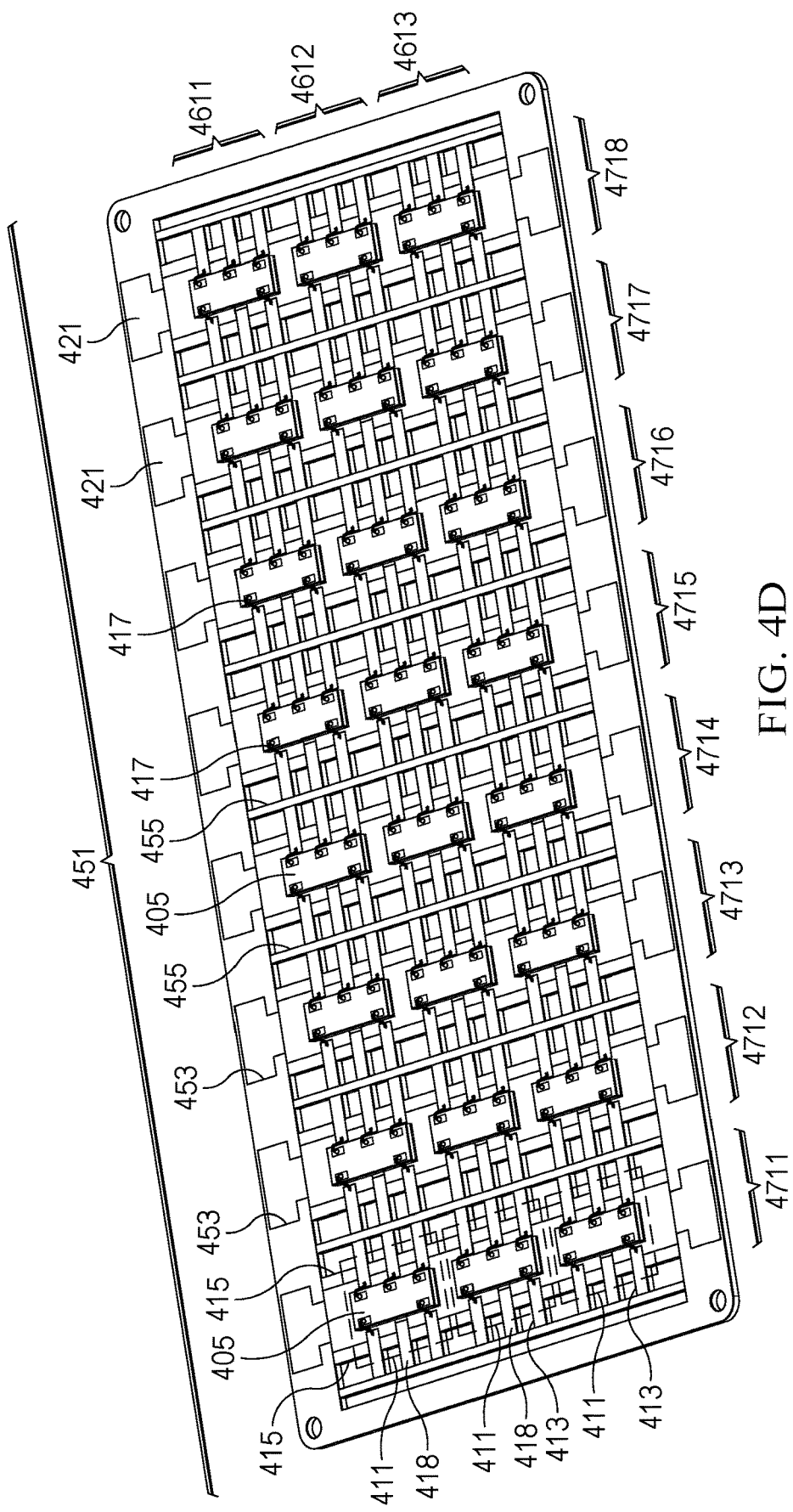

FIG. 4D illustrates the leadframe strip 451 of FIG. 4C after additional processing. In FIG. 4D, semiconductor dies 405 are shown after being mounted to the unit leadframes 411 on the dielectric die support material 421 using die attach epoxy or die attach film (not visible, as it is underneath the semiconductor dies 405) and wire bonds 419 are shown connecting the semiconductor dies 405 to leads 413 of the unit leadframes. The semiconductor dies are mounted and wire bonded to form the elements shown in FIG. 4D. Leads 418 do not have wire bonds 419 as the leads 418 are connected to central lead 416 and the semiconductor dies 405 are coupled to central leads 416 by the die attach epoxy.

Figure 4E:
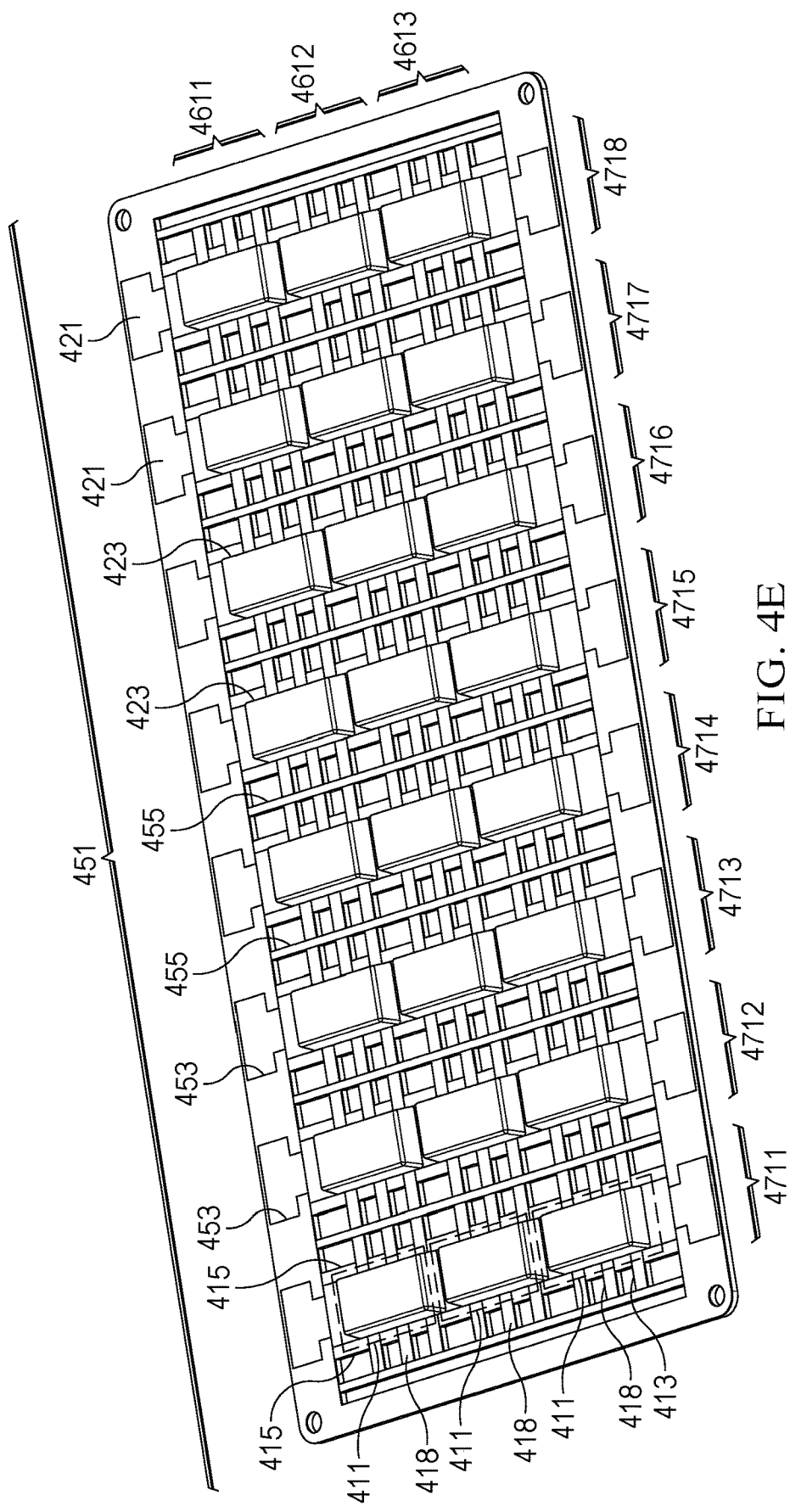

FIG. 4E illustrates the leadframe strip 451 of FIG. 4D after a second molding operation forms mold compound 423 on the unit leadframes 411. The second molding operation can be a transfer molding operation using EMC to cover the semiconductor dies 405, the bond wires 419, the dielectric die supports 421, and portions of the leads 413 and portions of leads 418 with mold compound to form packaged semiconductor devices. Unit molding was used in the illustrated example to form package bodies for each unit leadframe 411. In an alternative approach, a block molding process can be used for each of the columns of devices, and then, the block mold compound can be cut apart in a sawing operation. In addition, the leadframe strip 451 can be plated or entirely coated to improve solderability. Example coating include tin plating. Tin lead plating can be done after molding, and is referred to as "post mold plating." When a plated leadframe material is used for the leadframe, such as a palladium plated leadframe, the tin plating is not needed. Tin plating can be used with a bare copper leadframe to improve solderability and reduce corrosion.

Figure 4F:
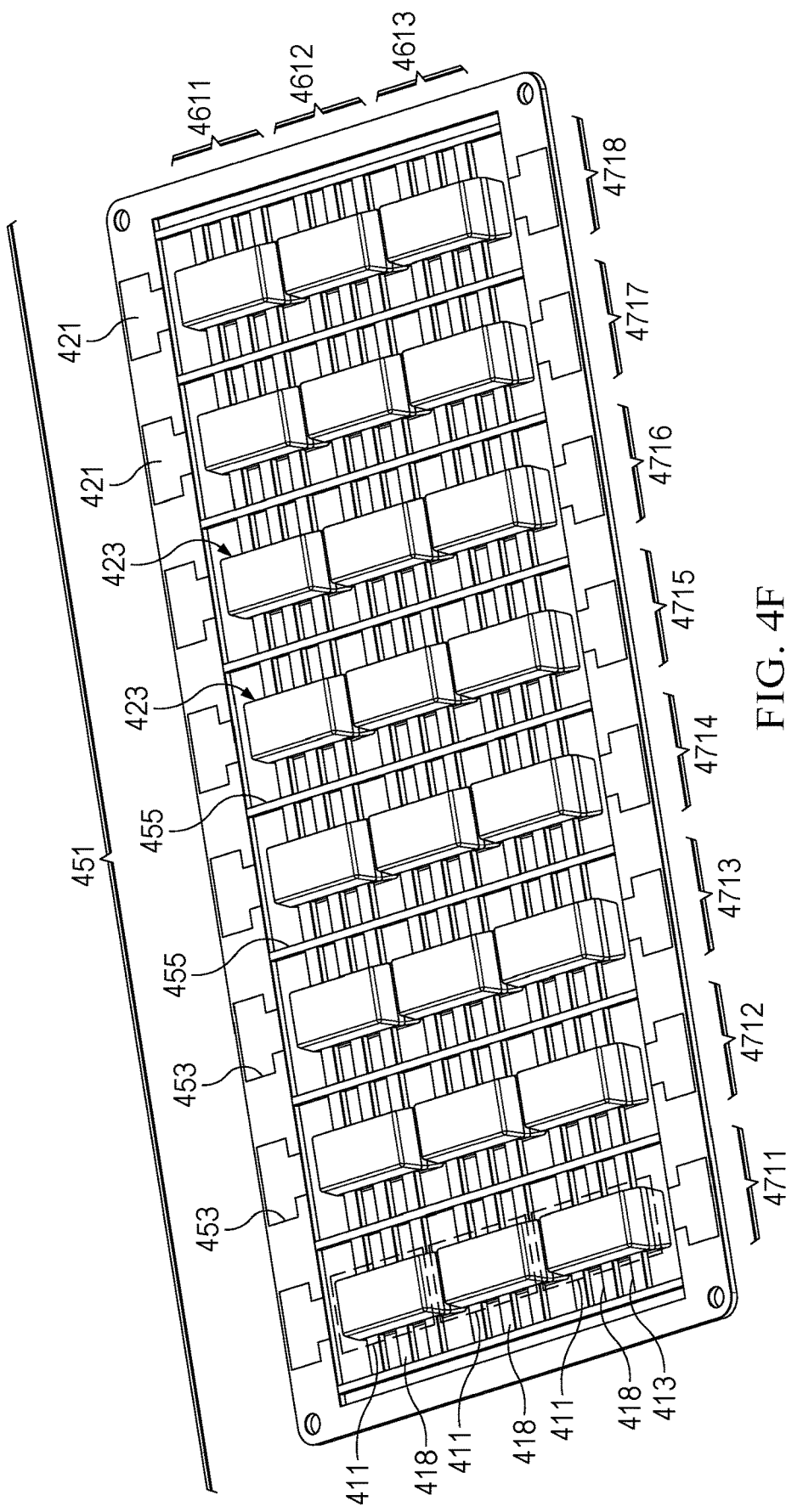
Figure 4G:
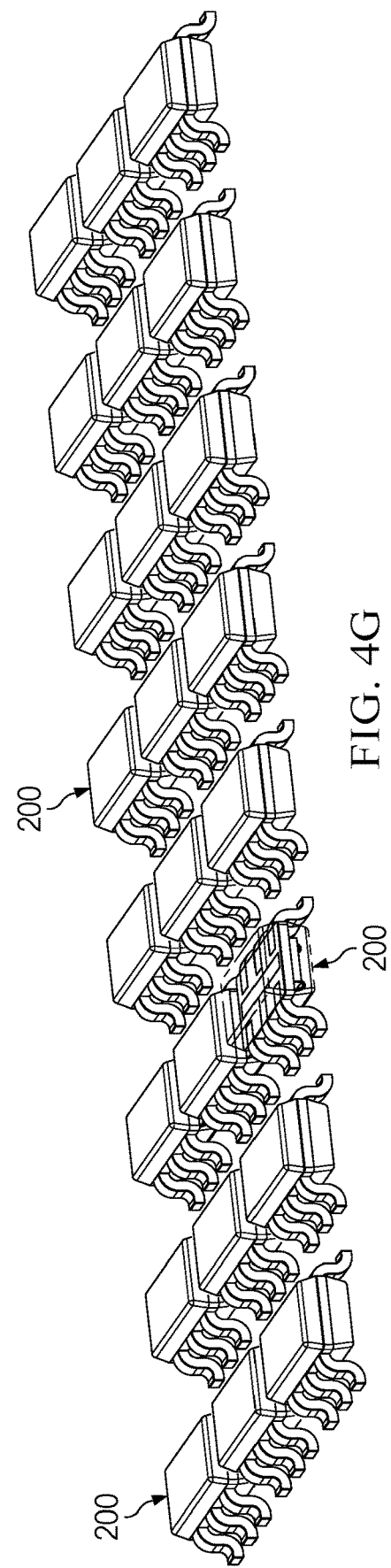

FIG. 4F illustrates, in another projection view, the leadframe strip 451 of FIG. 4E after additional processing. FIG. 4F shows the leadframe strip 451 after the dam bars (see 415 in FIG. 4E) are removed in a trim process in a trim form tool. The trim form tool cuts the dam bars 415 away, including between the leads 413, and leads 418, and prevents electrical shorts between the leads. In FIG. 4F the tie bars 455 still remain, connecting the leads 413 and leads 418 in each column of devices 4711, 4712 . . . 4718; these tie bars also connect the molded semiconductor devices to the leadframe strip 451. Tie bars 455 provide mechanical support for the leadframe 451 during processing.

FIG. 4G illustrates the completed semiconductor device packages 200 after the leads 413 and 418 are formed and the tie bars (see 455 in FIG. 4F, for example) are removed, separating the semiconductor device packages 200 from one another. In FIG. 4G the devices 200 are rotated with respect to FIGS. 4A-4F so that the devices 200 are shown with the board side facing down, as the devices will be mounted. As shown in FIG. 2A, each packaged device 200 has leads 213 and 218 that are shaped for solder mounting to a system board with feet 215.

Figure 5:
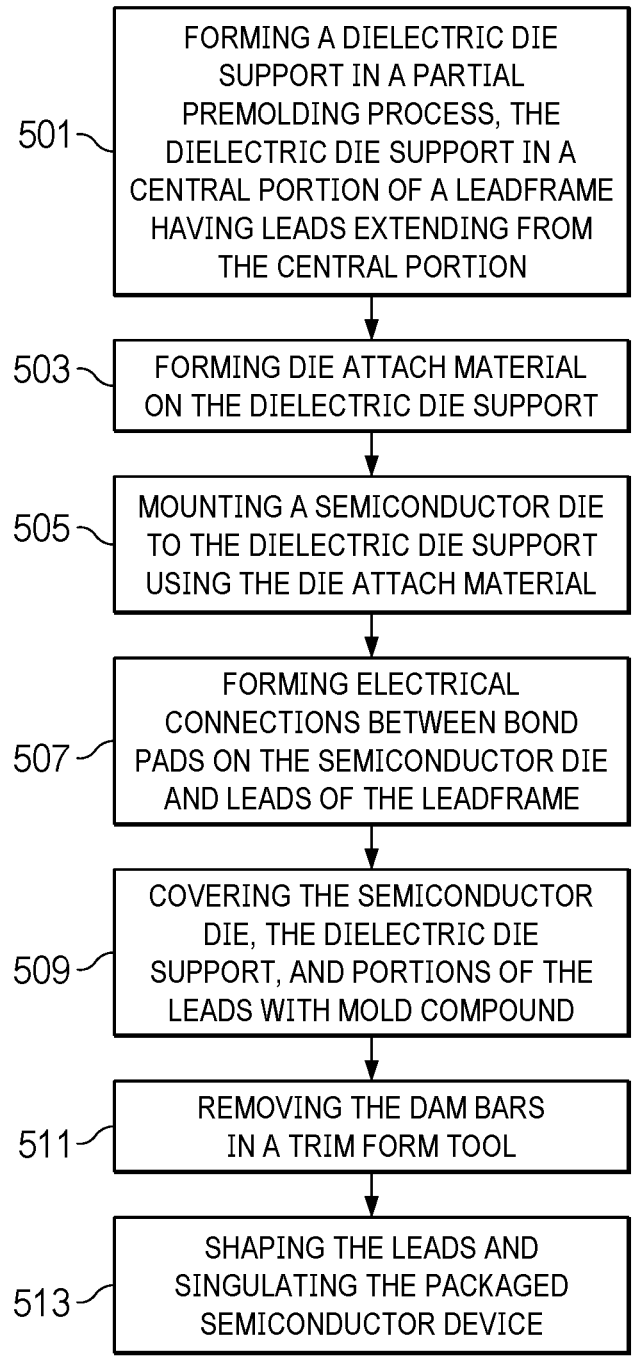
FIG. 5 illustrates, in a flow diagram, selected steps of a method for forming the arrangements.

FIG. 5 illustrates, in a flow diagram, steps for forming an arrangement corresponding to the steps shown in the series of illustrations of FIGS. 3A-3G.

At step 501, a partial premolding step forms a dielectric die support in a central portion of a unit leadframe having leads extending from the central portion (see FIG. 3A, unit leadframe 311, and FIG. 3B, dielectric die support 321).

At step 503, the method continues by forming die attach material on the dielectric die support (see dielectric die support 321 in FIGS. 3B-3C, and the die attach material 320 in FIG. 3C). The die attach material in an example arrangement is die attach epoxy. In an alternative arrangement, the die attach material can be die attach film. The die attach material is formed by depositing the material, for example die attach epoxy can be deposited using a needle, drop on demand, inkjet, or stencil. Die attach film or tape can be formed by attaching the die attach material to the dielectric die support.

At step 505 the method continues by mounting a semiconductor die to the dielectric die support using the die attach material. (See the die attach material 320 in FIG. 3C, and, the semiconductor die 305 mounted to the dielectric die support 321 by die attach material 320 in FIG. 3D).

At step 507, electrical connections are formed between the bond pads on the semiconductor die and the leads of the leadframe (see bond wires 319 formed between bond pads 308 and leads 313 in FIG. 3E). In an example the bond wires are formed of gold, copper, or palladium coated copper bond wire. In an alternative process ribbon bonding can be used.

At step 509, the method continues by forming semiconductor device packages using mold compound. The mold compound can be EMC, an epoxy, resin, or plastic. The mold compound can be formed using a transfer mold tool, covering the semiconductor die, the dielectric die support, and portions of the leads with the mold compound. (See the semiconductor die 305 in FIG. 3E and the mold compound 323 covering the semiconductor die 305 in FIG. 3F). Portions of leads 313, 318 are not covered by the mold compound 323, these portions extend from the package body and will form terminals for the completed semiconductor device package. In addition, the unit leadframe can be plated or entirely coated.

The method continues at step 511. In step 511, the dam bars 315 and tie bars (not shown in FIGS. 3A-3G) between the leads 313 are removed by a trim form tool that punches or cuts through the dam bars 315. (See the dam bars 315 in FIG. 3F, and the leadframe 311 in FIG. 3G, with the mold compound 323 forming the packaged semiconductor device, with leads 313 spaced from one another).

The method continues to step 513, which shapes the leads to form the packaged semiconductor devices and removes the tie bars from the leads (see leads 213 and the packaged semiconductor device 200 in FIG. 2).

Figure 6:
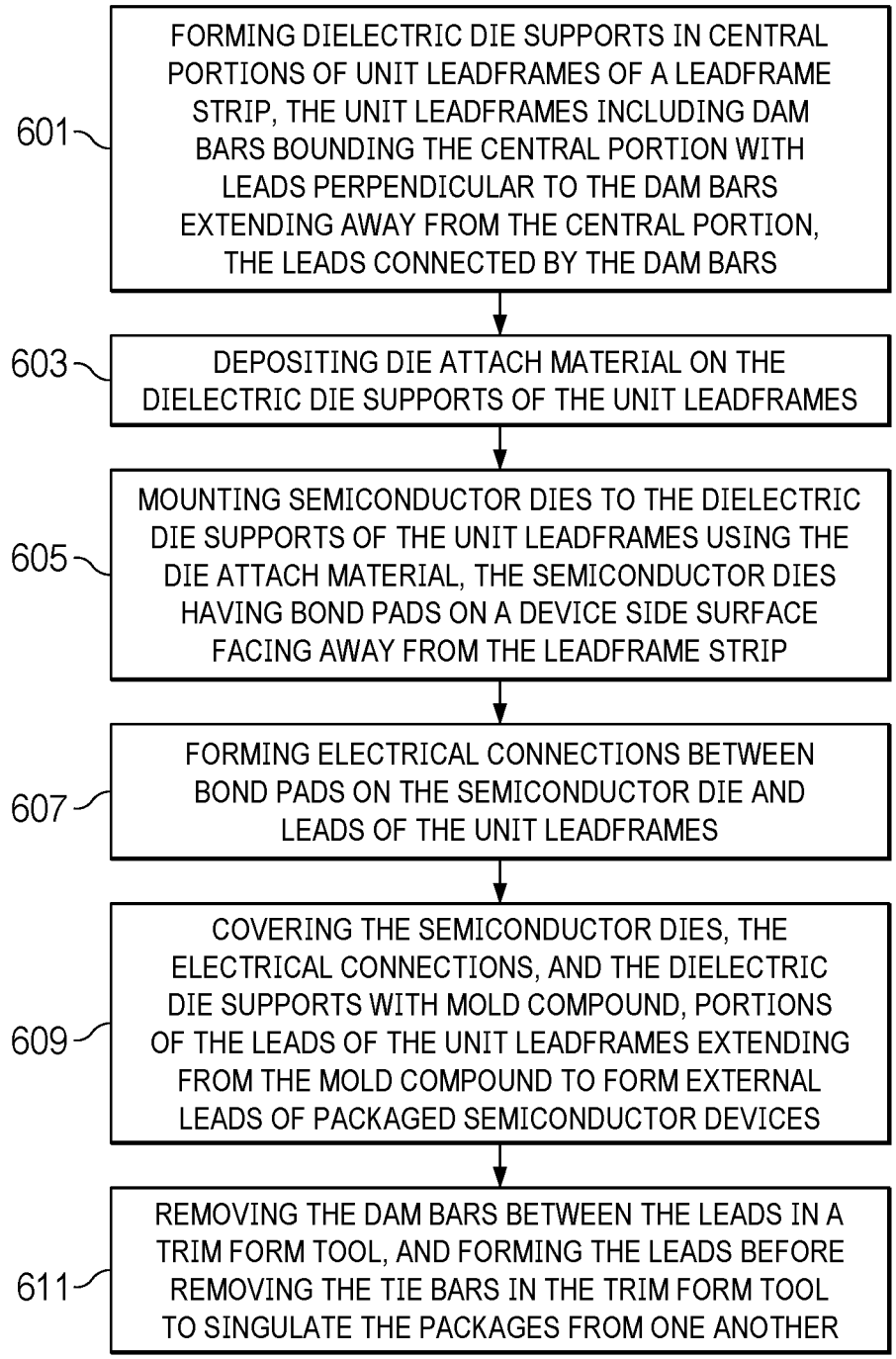
FIG. 6 illustrates, in a flow diagram, selected steps of an additional method for forming the arrangements.

FIG. 6 illustrates in an additional flow diagram a selected steps for a method for forming the arrangements using a leadframe strip and corresponding to the series of illustrations of FIGS. 4A-4B, FIG. 4BB, and FIGS. 4C-4G.

At step 601, dielectric die supports are formed in central portions of unit leadframes of a leadframe strip. The unit leadframes include dam bars bounding the central portion with leads perpendicular to the dam bars extending away from the central portion. The leads are connected by the dam bars. (See leadframe strip 451 shown in FIG. 4A with unit leadframes 411, and dam bars 415. In FIG. 4A, mold gates 453 are shown arranged for the premolding operation that forms the dielectric die support material, FIG. 4B shows the transfer mold tool in operation, and FIG. 4C shows the dielectric die support material 421 formed in the columns of unit leadframes 411 (the columns are labeled 4711, 4712 . . . 4718) with three rows (labeled 4611, 4612, 4613) of unit leadframes 411 in each column. The dielectric die support material 421 for each unit leadframe are bounded by the dam bars 415 for each column. Leads 413 and 418 are tied together by the dam bars 415 and by tie bars 455, the tie bars 455 support the leads 413, 418 between columns of unit leadframes 411.)

At step 603, die attach material is deposited on the dielectric die supports of the unit leadframes. The die attach material can be a conductive die attach epoxy or paste. Suitable die attach materials are commercially available from Henkel, of Rocky Mount Connecticut, USA, and labeled "ABLESTIK LOCTITE" products. In an alternative to die attach epoxy materials, die attach film, also available from Henkel, can be used. The die attach epoxy can be filled with a conductor such as silver.

At step 605, the method continues by mounting semiconductor dies to the dielectric die supports of the unit leadframes using the die attach material. The semiconductor dies have bond pads 408 on a device side surface that faces away from the leadframe strip 451. (See FIG. 4D, leadframe strip 451 is shown after the semiconductor dies 405 are mounted on the dielectric die support material 421 for the unit leadframes 411.)

At step 607, electrical connections are formed between the bond pads on the semiconductor dies and the leads of the unit leadframes. (See FIG. 4D, bond wires 419 in FIG. 4D connect the bond pads 408 of semiconductor devices 405 to the leads 413 on the unit leadframes 411.) The electrical connections can be formed by wire bonding, as shown in the example arrangements illustrated, or by ribbon bonding.

At step 609 a molding operation covers the semiconductor die, the electrical connections, the dielectric die support material and portions of the leads of the unit leadframes with mold compound, while portions of the leads extend from the mold compound to form external leads of packaged semiconductor devices. (FIG. 4E illustrates the leadframe strip 451 after the mold compound 423 is formed.) The mold compound can be EMC, an epoxy, a resin, or a plastic and in an example process is a thermoset epoxy resin mold compound that is applied in a transfer mold tool. In addition, post mold plating such as tin plating can be done.

At step 611 the dam bars are removed in a trim form tool. The dam bars can be removed by a punch or cutting operation and the leads are separated from one another. The leads are formed by mechanical pressure to shape the ends, and the tie bars are also removed to singulate the packaged semiconductor devices from the leadframe strip and from one another. (FIG. 4F illustrates the leadframe strip 451 after the dam bars 415 are removed. FIG. 4G illustrates the completed semiconductor device packages 200 after the leads 413 are formed, and the semiconductor device packages 200 are removed from the leadframe strip 451.)

Use of the arrangements provides a wire bonded semiconductor device package with a dielectric die support that enables a small semiconductor device package with reliable wire bond or ribbon bond connections. Existing materials and assembly tools are used to form the arrangements, and the arrangements are low in cost when compared to solutions using additional circuit boards or modules to carry the antennas. The arrangements are formed using existing methods, materials and tooling for making the devices and are cost effective.

Modifications are possible in the described arrangements, and other alternative arrangements are possible within the scope of the claims.

What is claimed is:
1. An apparatus, comprising:
a metal leadframe and a dielectric die support formed in a central portion of the metal leadframe, and having metal leads extending from the central portion, portions of the metal leads extending into the central portion in contact with the dielectric die support, a portion of the each of the metal leads within the dielectric support;

die attach material over the dielectric die support;
a semiconductor die mounted to the dielectric die support by the die attach material, the semiconductor die having bond pads on a device side surface facing away from the dielectric die support;
electrical connections extending from the bond pads to metal leads of the metal leadframe; and
mold compound covering the semiconductor die, the electrical connections, the dielectric die support, and portions of the metal leads, the mold compound forming a package body.

2. The apparatus of claim 1, wherein the dielectric die support is formed of epoxy mold compound.

3. The apparatus of claim 1, wherein the dielectric die support is formed from epoxy mold compound, resin, epoxy, epoxy resin, a dielectric tape, or a dielectric film.

4. The apparatus of claim 1, wherein the metal leadframe further comprises a central lead in the central portion, the central lead arranged perpendicular to the metal leads, and the metal leads are in parallel.

5. The apparatus of claim 4, wherein the dielectric die support surrounds and contacts the central lead.

6. The apparatus of claim 5, wherein the die attach material is electrically and thermally conductive, and the semiconductor die is electrically and thermally coupled to the central lead.

7. The apparatus of claim 6, wherein the central lead is connected to a metal lead of the metal leadframe.

8. The apparatus of claim 1, wherein the die attach material is a die attach epoxy.

9. The apparatus of claim 1, wherein the die attach material is a die attach film.

10. The apparatus of claim 1, wherein the metal leadframe has the central portion that is an opening that is free from leads, and the dielectric die support fills the opening.

11. The apparatus of claim 1, wherein the apparatus forms a small outline transistor (SOT) semiconductor device package, a small outline integrated circuit (SOIC) semiconductor device package or a small outline package (SOP) semiconductor device package.

12. The apparatus of claim 1, wherein the electrical connections are ribbon bonds or bond wires.

13. A method of forming a semiconductor package, comprising:
forming a dielectric die support in a central portion of a metal leadframe, the metal leadframe having metal leads extending from the central portion, wherein a plane along a top surface of each of the metal leads is approximately coplanar with a plane along a portion of a top surface of the dielectric die support;
forming a die attach material over the dielectric die support;
mounting a semiconductor die over the dielectric die support using the die attach material, the semiconductor die having bond pads on a device side surface facing away from the metal leadframe;
forming electrical connections between bond pads of the semiconductor die and metal leads of the metal leadframe; and
covering the semiconductor die, the dielectric die support, the electrical connections and portions of the metal leads with mold compound.

14. The method of claim 13, wherein forming the dielectric die support further comprises:
dispensing liquid epoxy mold compound into the central portion of the metal leadframe, the metal leadframe including dam bars arranged perpendicular to and connecting the metal leads and bounding the central portion, the liquid mold compound contacting the dam bars and surrounding and contacting a central lead of the metal leadframe; and
curing the liquid mold compound to form the dielectric die support.

15. The method of claim 13, wherein forming the dielectric die support further comprises:
dispensing liquid mold compound into the central portion of the metal leadframe, the central portion including a central opening free from leads, the leadframe including dam bars perpendicular to the leads and bounding the central portion, the liquid mold compound filling the central opening and contacting the dam bars; and
curing the liquid mold compound to form the dielectric die support.

16. A method of forming a semiconductor package, comprising:
performing a first molding operation on a metal leadframe strip that comprises unit leadframes arranged in rows and columns, the unit leadframes including dam bars bounding a central portion with metal leads perpendicular to the dam bars and extending away from the central portion, the first molding operation forming a dielectric die support in the central portion of the unit leadframes, the dielectric die support filling the central portion bounded by the dam bars and contacting the dam bars, the metal leads connected by the dam bars;
depositing die attach material on the dielectric die supports of the unit leadframes;
mounting semiconductor dies to the dielectric die supports of the unit leadframes using the die attach material, the semiconductor dies having bond pads on a device side surface facing away from the metal leadframe strip;
forming electrical connections between the bond pads and meal leads of the unit leadframes; and
in a second molding operation, covering the semiconductor dies, the electrical connections, and the dielectric die supports of the unit leadframes with mold compound, portions of the leads of the unit leadframes extending from the mold compound to form terminals of packaged semiconductor devices.

17. The method of claim 16, and further comprising:
trimming the dam bars from the metal leads of the unit leadframes in the metal leadframe strip, the trimming removing the dam bars between the leads to disconnect the leads from one another where the dam bars connected the leads;
forming external ends of the metal leads of the packaged semiconductor devices to create a foot at the ends, the foot configured for solder mounting the packaged semiconductor devices to a circuit board;
trimming tie bars from the metal leads of the unit leadframes to separate the metal leads from one another; and
singulating the packaged semiconductor devices from the leadframe strip by cutting through the leadframe strip between the packaged semiconductor devices.

18. The method of claim 16, wherein depositing the die attach material further comprises depositing die attach epoxy or die attach film.

19. The method of claim 16, wherein the central portion of the unit leadframes comprises a central lead within the central portion that is perpendicular to the metal leads, the dielectric die support surrounding and in contact with the central lead.

20. The method of claim 19, wherein depositing the die attach material further comprises depositing electrically conductive die attach material, and mounting the semiconductor dies further comprises mounting semiconductor dies to the dielectric die support that are electrically coupled to the central lead portion.

\* \* \* \* \*